(12) United States Patent
Liu et al.

(10) Patent No.: US 11,815,633 B2
(45) Date of Patent: Nov. 14, 2023

(54) APPARATUSES FOR RADIATION DETECTION AND METHODS OF MAKING THEM

(71) Applicant: SHENZHEN XPECTVISION TECHNOLOGY CO., LTD., Shenzhen (CN)

(72) Inventors: Yurun Liu, Shenzhen (CN); Peiyan Cao, Shenzhen (CN)

(73) Assignee: SHENZHEN XPECTVISION TECHNOLOGY CO., LTD., Shenzhen (CN)

( * ) Notice: Subject to any disclaimer, the term of this patent is extended or adjusted under 35 U.S.C. 154(b) by 103 days.

(21) Appl. No.: 17/471,670

(22) Filed: Sep. 10, 2021

(65) Prior Publication Data
US 2021/0405221 A1 Dec. 30, 2021

Related U.S. Application Data

(63) Continuation of application No. PCT/CN2019/080403, filed on Mar. 29, 2019.

(51) Int. Cl.
*G01T 1/24* (2006.01)
*G01T 1/29* (2006.01)

(52) U.S. Cl.
CPC .............. *G01T 1/24* (2013.01); *G01T 1/2928* (2013.01)

(58) Field of Classification Search
CPC .................................. G01T 1/24; G01T 1/2928
See application file for complete search history.

(56) References Cited

U.S. PATENT DOCUMENTS

| | | |
|---|---|---|
| 4,203,781 A | 5/1980 | Miller |
| 2006/0138477 A1 | 6/2006 | Suh |
| 2007/0072332 A1 | 3/2007 | Kemmer |
| 2010/0078680 A1* | 4/2010 | Cheng ................. H01L 27/1446 257/292 |
| 2011/0037133 A1* | 2/2011 | Su ....................... H01L 31/1808 257/E31.127 |
| 2015/0318211 A1 | 11/2015 | Guo et al. |
| 2016/0254152 A1* | 9/2016 | Cheng ............... H01L 29/66462 257/190 |

(Continued)

FOREIGN PATENT DOCUMENTS

| | | |
|---|---|---|
| CN | 103477455 A | 12/2013 |
| CN | 104733519 A | 6/2015 |

(Continued)

*Primary Examiner* — Hugh Maupin
(74) *Attorney, Agent, or Firm* — IPRO, PLLC; Qian Gu

(57) ABSTRACT

Disclosed herein are apparatuses for detecting radiation and methods of making them. The method comprises forming a recess into a semiconductor substrate, wherein a portion of the semiconductor substrate extends into the recess and is surrounded by the recess; depositing semiconductor nanocrystals into the recess, the semiconductor nanocrystals having a different composition from the semiconductor substrate; forming a first doped semiconductor region in the semiconductor substrate; forming a second doped semiconductor region in the semiconductor substrate; wherein the first doped semiconductor region and the second doped semiconductor region form a p-n junction that separates the portion from the rest of the semiconductor substrate.

20 Claims, 23 Drawing Sheets

(56) References Cited

U.S. PATENT DOCUMENTS

2017/0294510 A1    10/2017   Guo et al.
2019/0198667 A1*    6/2019   Liu .......................... H01L 29/78
2021/0091207 A1*    3/2021   Yu ................... H01L 21/823885

FOREIGN PATENT DOCUMENTS

| CN | 105122454 A   | 12/2015 |
| CN | 105938847 A   | 9/2016  |
| JP | 2011257255 A  | 12/2011 |
| KR | 20140083747 A | 7/2014  |
| TW | I229190 B     | 3/2005  |
| WO | 2016178837 A1 | 11/2016 |
| WO | 2019019040 A1 | 1/2019  |
| WO | 2019019052    | 1/2019  |

* cited by examiner

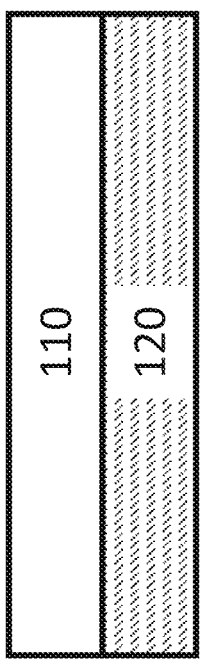

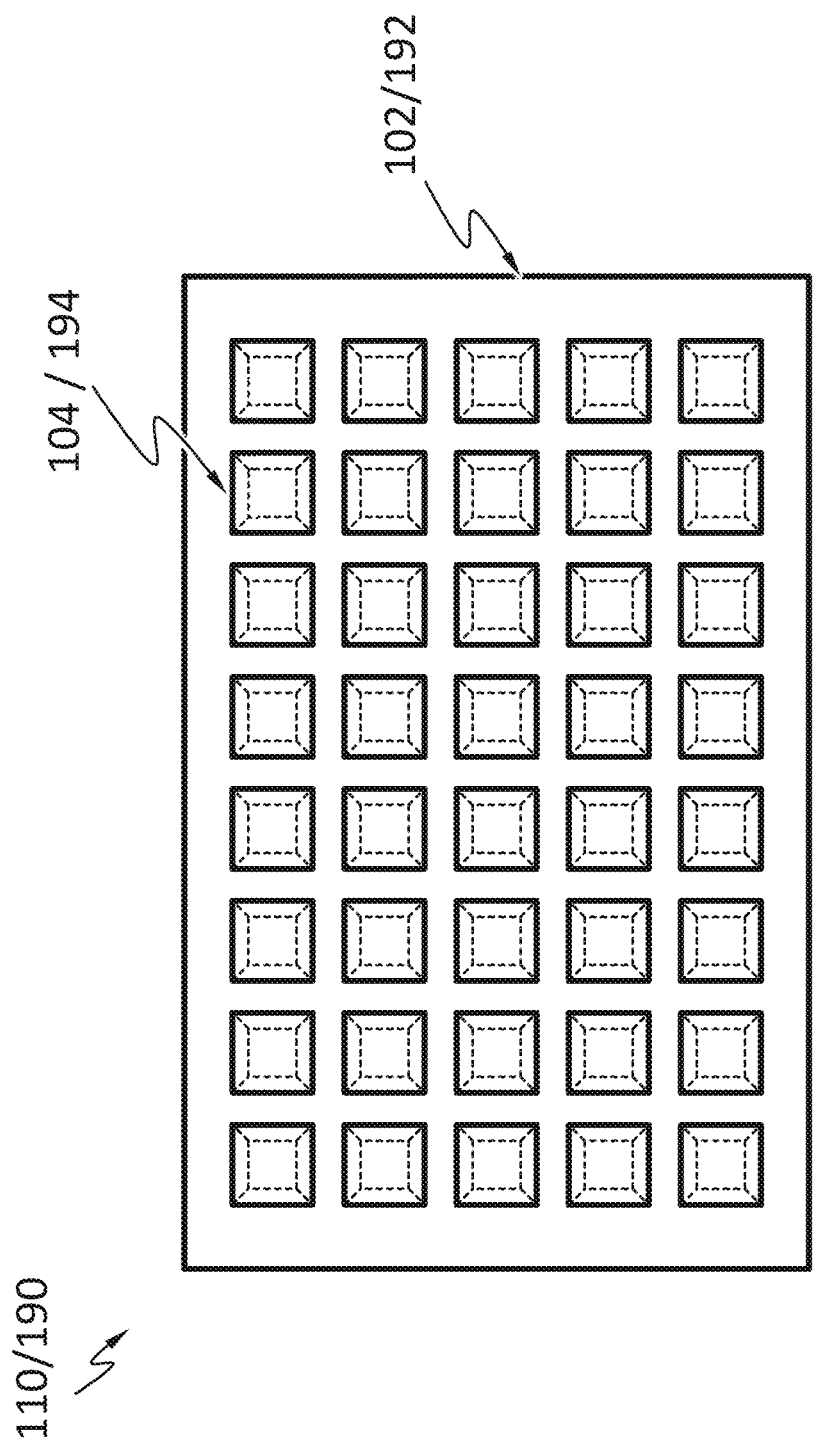

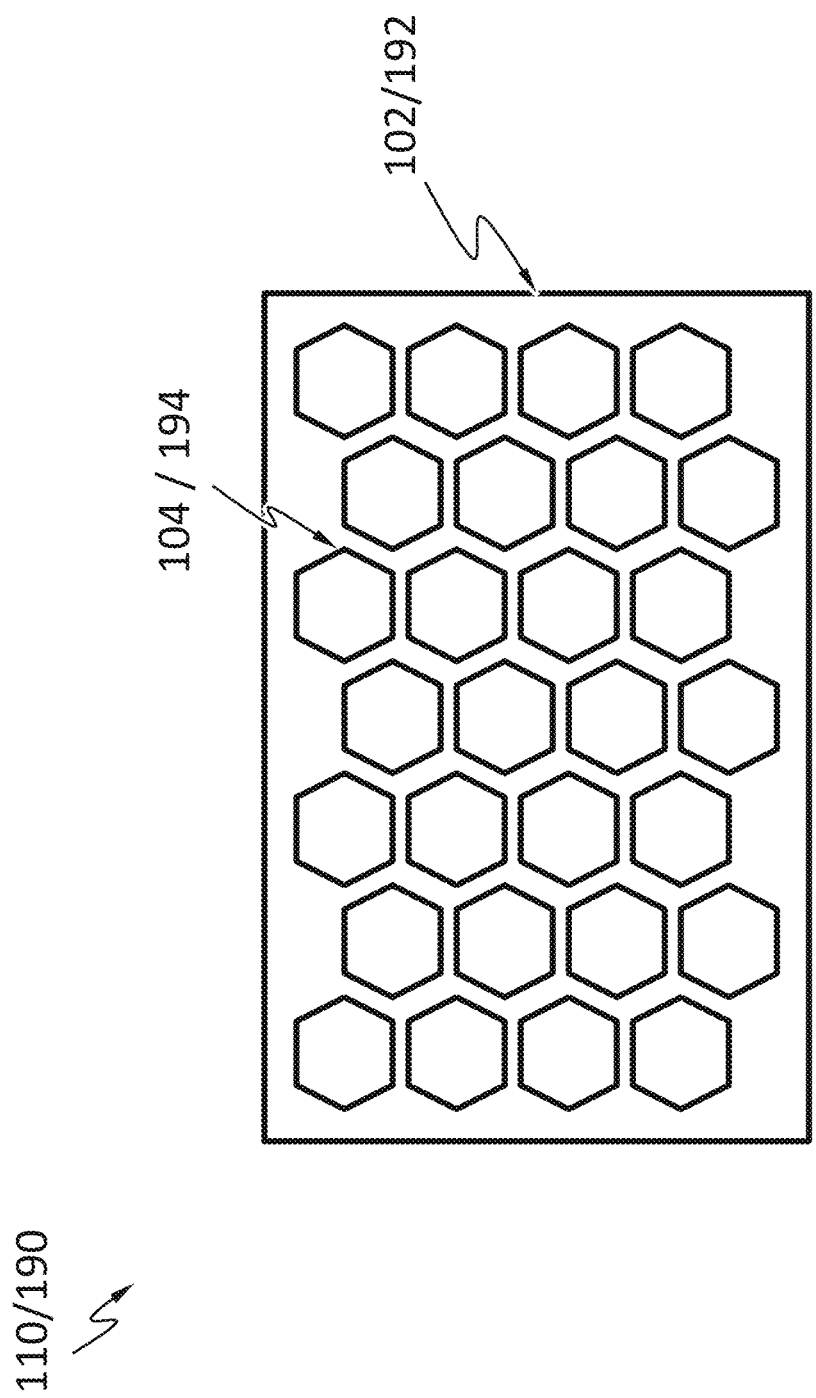

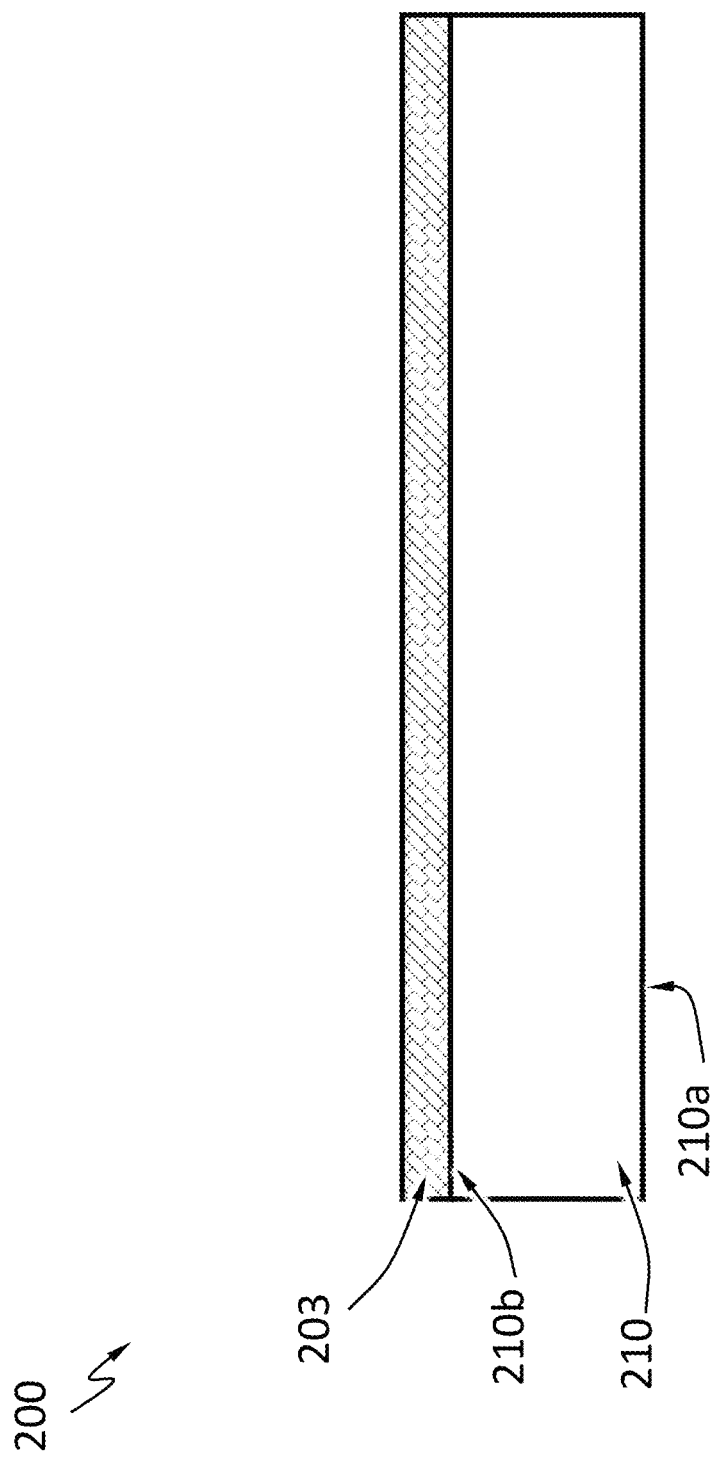

APPARATUSES FOR RADIATION DETECTION AND METHODS OF MAKING THEM

TECHNICAL FIELD

The disclosure herein relates to apparatuses for radiation detection and methods of making them.

BACKGROUND

A radiation detector is a device that measures a property of a radiation. Examples of the property may include a spatial distribution of the intensity, phase, and polarization of the radiation. The radiation may be one that has interacted with a subject. For example, the radiation measured by the radiation detector may be a radiation that has penetrated or reflected from the subject. The radiation may be an electromagnetic radiation such as infrared light, visible light, ultraviolet light, X-ray or γ-ray. The radiation may be of other types such as α-rays and β-rays.

One type of radiation detectors is based on interaction between the radiation and a semiconductor. For example, a radiation detector of this type may have a semiconductor layer that absorbs the radiation and generate charge carriers (e.g., electrons and holes) and circuitry for detecting the charge carriers.

Cadmium Zinc Telluride (CdZnTe, or $Cd_{1-x}Zn_xTe$) is a direct gap semiconductor and is an excellent candidate for room temperature radiation detection. Cadmium Zinc Telluride is an alloy of zinc telluride and cadmium telluride (CdTe) and the x-value is the molar concentration of Zn in CdZnTe. CdZnTe with x-value from 0.04 to 0.2 is considered promising for detector development as it processes and improves some of the properties of CdTe. For example, both CdTe and CdZnTe have large atomic number that gives the material excellent stopping power for high absorption efficiencies for incident X-rays, γ-rays, and have large band gaps (e.g., 1.5 eV-1.6 eV) allowing room temperature detector operations and have high resistivity to achieve a good signal-to-noise ratio of the radiation detectors. Meanwhile, the CdZnTe has a larger band gap than CdTe due to incorporation of Zn hence increases the maximum achievable electrical resistivity.

The practical use of CdTe and CdZnTe detectors covers a wide variety of applications, such as medical and industrial imaging, industrial gauging and non-destructive testing, security and monitoring, nuclear safeguards and non-proliferation, and astrophysics.

SUMMARY

Disclosed herein is a method that comprises forming a recess into a semiconductor substrate, wherein a portion of the semiconductor substrate extends into the recess and is surrounded by the recess; depositing semiconductor nanocrystals into the recess, the semiconductor nanocrystals having a different composition from the semiconductor substrate; forming a first doped semiconductor region in the semiconductor substrate; forming a second doped semiconductor region in the semiconductor substrate; wherein the first doped semiconductor region and the second doped semiconductor region form a p-n junction that separates the portion from the rest of the semiconductor substrate.

According to an embodiment, the first doped semiconductor region surrounds the second doped semiconductor region.

According to an embodiment, the second doped semiconductor region is in electrical contact with the portion.

According to an embodiment, forming the second doped semiconductor region comprises doping a portion of the first doped semiconductor region.

According to an embodiment, the first doped semiconductor region extends from a surface of the semiconductor substrate to an interface between the recess and the semiconductor substrate.

According to an embodiment, the second doped semiconductor region is coextensive with the first doped semiconductor region.

According to an embodiment, forming the recess comprises forming a mask on the semiconductor substrate and etching an area of the semiconductor substrate uncovered by the mask.

According to an embodiment, the mask comprises a metal, silicon nitride, silicon dioxide, or carbon.

According to an embodiment, etching the area is by wet etching, dry etching or a combination thereof.

According to an embodiment, the semiconductor substrate comprises silicon, germanium, GaAs or a combination thereof.

According to an embodiment, the semiconductor nanocrystals are cadmium zinc telluride (CdZnTe) nanocrystals, cadmium telluride (CdTe) nanocrystals, cadmium selenide (CdSe) nanocrystals, cadmium sulfide (CdS) nanocrystals, or lead sulfide (PbS) nanocrystals.

According to an embodiment, the recess has a shape of a frustum, prism, pyramid, cuboid, or cylinder.

According to an embodiment, the semiconductor nanocrystals have diameters of 10 nanometer or less.

According to an embodiment, the method disclosed herein further comprises bonding the semiconductor substrate to another substrate comprising an electronic system therein or thereon, wherein the electronic system is electrically connected to the second doped semiconductor region and configured to process an electrical signal generated in the semiconductor substrate.

Disclosed herein is a method that comprises forming a through hole in a semiconductor layer supported directly on an electrical insulator layer, wherein a portion of the semiconductor layer remains in and is surrounded by the through hole; depositing semiconductor nanocrystals into the through hole, the semiconductor nanocrystals having a different composition from the semiconductor layer; forming an opening through the electrical insulator layer so that the portion is exposed in the opening; forming an electrode in the opening, the electrode being in electrical contact to the portion.

According to an embodiment, forming the through hole comprises forming a mask on the semiconductor layer and etching an area of the semiconductor layer uncovered by the mask.

According to an embodiment, the semiconductor layer comprises silicon, germanium, GaAs or a combination thereof.

According to an embodiment, the electrical insulator layer comprises an oxide, a nitride or an oxynitride.

According to an embodiment, the through hole has a shape of a frustum, prism, pyramid, cuboid, or cylinder.

According to an embodiment, the method further comprises bonding the electrical insulator layer to an electronics layer comprising an electronic system electrically connected to the electrode and configured to process an electrical signal generated in the semiconductor layer.

Disclosed herein is a radiation detector that comprises a semiconductor substrate; a recess in the semiconductor substrate, wherein a portion of the semiconductor substrate extends into the recess and is surrounded by the recess; semiconductor nanocrystals in the recess, the semiconductor nanocrystals having a different composition from the semiconductor substrate; a first doped semiconductor region in the semiconductor substrate; and a second doped semiconductor region in the semiconductor substrate; wherein the first doped semiconductor region and the second doped semiconductor region form a p-n junction that separates the portion from the rest of the semiconductor substrate.

According to an embodiment, the radiation detector is configured to absorb particles of radiation incident on the semiconductor nanocrystals and to generate charge carriers.

Disclosed herein is a radiation detector that comprises an electrical insulator layer; a semiconductor layer supported directly on the electrical insulator layer; a through hole in the semiconductor layer, wherein a portion of the semiconductor layer extends into the through hole and is surrounded by the through hole; semiconductor nanocrystals in the through hole, the semiconductor nanocrystals having a different composition from the semiconductor layer; and an electrode through the electrical insulator layer, the electrode being in electrical contact to the portion.

BRIEF DESCRIPTION OF FIGURES

FIG. 1 schematically shows a cross-sectional view of a radiation detector, according to an embodiment.

FIG. 2C-FIG. 2E each schematically show a top view of the radiation absorption layer, according to an embodiment.

DETAILED DESCRIPTION

FIG. 1 schematically shows a cross-sectional view of a radiation detector 100, according to an embodiment. The radiation detector 100 may include a radiation absorption layer 110 configured to absorb incident radiation and generate electrical signals from the incident radiation, and an electronics layer 120 (e.g., an ASIC) for processing or analyzing the electrical signals generated in the radiation absorption layer 110. The radiation detector 100 may or may not include a scintillator. The radiation absorption layer 110 may include a semiconductor material such as, silicon, germanium, GaAs, CdTe, CdZnTe, or a combination thereof. The semiconductor may have a high mass attenuation coefficient for the radiation of interest.

Figure 2A:
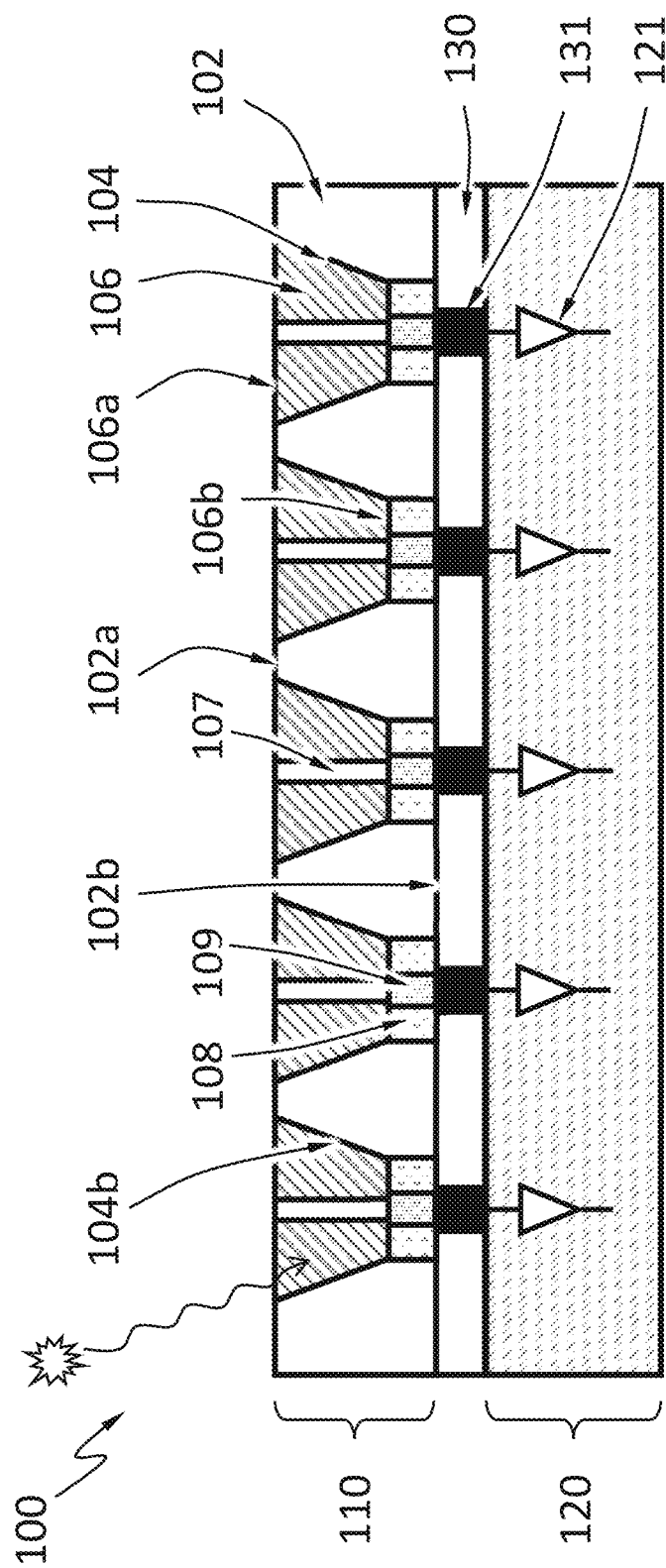
FIG. 2A schematically shows a detailed cross-sectional view of the radiation detector, according to an embodiment.

FIG. 2A schematically shows a detailed cross-sectional view of the radiation detector 100, according to an embodiment. The radiation detector 100 has a semiconductor substrate 102 and a recess 104 in the semiconductor substrate 102. A portion 107 of the semiconductor substrate 102 extends into the recess 104 and is surrounded by the recess 104. The radiation detector 100 has semiconductor nanocrystals 106 in the recess 104. The radiation detector 100 further has a first doped semiconductor region 108 in the semiconductor substrate 102 and a second doped semiconductor region 109 in the semiconductor substrate 102. The first doped semiconductor region 108 and the second doped semiconductor region 109 form a p-n junction that separates the portion 107 from the rest of the semiconductor substrate 102. In other words, every electric pathway between the portion 107 and the rest of the semiconductor substrate 102 and entirely inside the semiconductor substrate 102 traverses this p-n junction. The portion 107 may be in electrical contact with the second doped semiconductor region 109. The semiconductor substrate 102 (including the portion 107), the semiconductor nanocrystals 106, the first doped semiconductor region 108, and the second doped semiconductor region 109 may be in the radiation absorption layer 110.

The semiconductor substrate 102 may have a semiconductor material such as silicon, germanium, GaAs, a combination thereof, or other suitable semiconductors. The semiconductor substrate 102 may be an extrinsic semiconductor (i.e., doped with electron donors or electron acceptors).

The second doped semiconductor region 109 may be surrounded by the first doped semiconductor region 108. The second doped semiconductor region 109 is not necessarily in the center of the first doped semiconductor region 108. The first doped semiconductor region 108 may extend from a surface 102b of the semiconductor substrate 102 to an interface 106b between the recess 104 and the semiconductor substrate 102. The second doped semiconductor region 109 may be coextensive with the first doped semiconductor region 108, for example, in a direction perpendicular to the semiconductor substrate 102.

The portion 107 may be a cylinder or prism (e.g., rectangular prism or triangular prism). The portion 107 may have a height (i.e., a dimension in a direction perpendicular to the semiconductor substrate 102) equal to, longer than or shorter than the height of the recess 104. The portion 107 may have a height of a few micrometers. The portion 107 may have the same type of doping as the second doped semiconductor region 109 (e.g., both n-type or both p-type), but have the opposite type of doping from the rest of the semiconductor substrate 102 (e.g., the portion 107 being n-type and the rest of the semiconductor substrate 102 being p-type, or vice versa).

In an embodiment, the semiconductor nanocrystals 106 may have a different composition from the semiconductor substrate 102. Namely, the semiconductor nanocrystals 106 do not merely differ from the semiconductor substrate 102 in terms of doping.

Here, semiconductor nanocrystals 106 may refer to crystals having diameters between about 1 nm and about 100 nm. In an embodiment, the semiconductor nanocrystals 106 may have diameters of 10 nanometer or less. The semiconductor nanocrystals 106 may be synthesized by various techniques that are known to the skilled in the art. The semiconductor nanocrystals 106 may be in different shapes and orientations.

In an embodiment, the semiconductor nanocrystals 106 may be cadmium zinc telluride (CdZnTe) nanocrystals, cadmium telluride (CdTe) nanocrystals, cadmium selenide (CdSe) nanocrystals, cadmium sulfide (CdS) nanocrystals, or lead sulfide (PbS) nanocrystals, or another suitable nanocrystals that can absorb particles of radiation incident thereon and generate charge carriers. The semiconductor nanocrystals 106 may have a sufficient thickness and thus a sufficient absorbance (e.g., >80% or >90%) for incident particles of radiation of interest (e.g., X-ray photons). The semiconductor nanocrystals 106 are in electrical contact with the portion 107 and the rest of the semiconductor substrate 102.

When the radiation hits the radiation absorption layer 110, the semiconductor nanocrystals 106 may absorb the particles of radiation incident thereon and generate one or more charge carriers by a number of mechanisms. A particle of radiation may generate 1 to 100000 charge carriers. The charge carriers may comprise electrons and holes. The charge carriers may drift to a sidewall 104*b* of the recess 104 and the portion 107 under an electric field between the portion 107 and the rest of the semiconductor substrate 102. For example, the holes may drift to the sidewall 104*b*, and the electrons may drift to the portion 107.

In an embodiment, the p-n junction formed by the first doped semiconductor region 108 and the second doped semiconductor region 109 may be under a reverse bias during operation of the radiation detector 100. This reverse bias may be used to establish an electric field between the portion 107 and the rest of the semiconductor substrate 102. The p-n junction under the reverse bias essentially blocks electric current traversing the p-n junction but allows electric current to flow between the portion 107 and the electronics layer 120 through the second doped semiconductor region 109.

The electronics layer 120 may include an electronic system 121 configured to process electrical signals on the portion 107 generated from the charge carriers collected. The electronic system 121 may include an analog circuitry such as a filter network, amplifiers, integrators, and comparators, or a digital circuitry such as a microprocessor, and memory. The electronic system 121 may include one or more ADCs. The electronic system 121 may be electrically connected to the portion 107 through a via 131 and the second doped semiconductor region 109. Space among the vias may be filled with a filler material 130, which may increase the mechanical stability of the connection of the electronics layer 120 to the radiation absorption layer 110. Other bonding techniques are possible to connect the electronic system 121 to the portion 107 or the portion 197 without using vias.

Figure 2B:
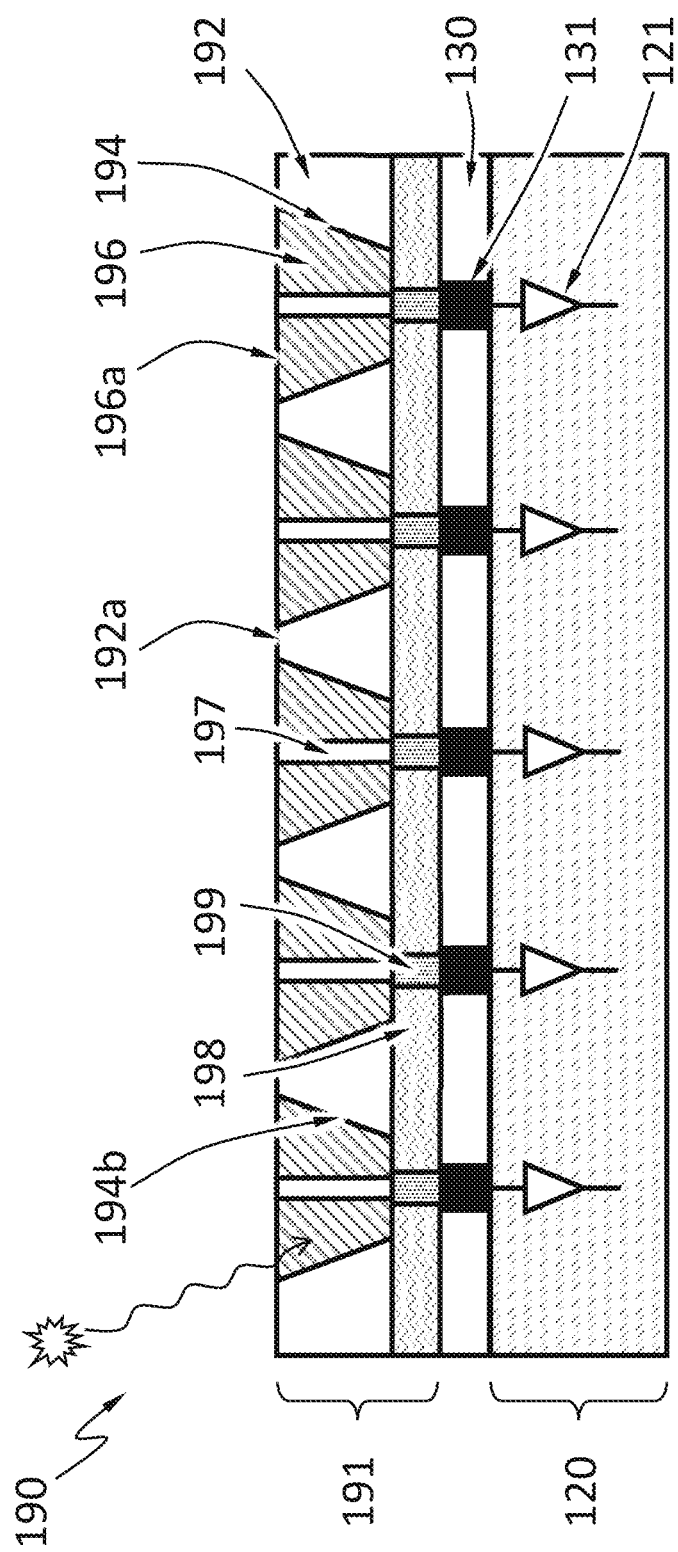
FIG. 2B schematically shows a detailed cross-sectional view of the radiation detector, according to an embodiment.

FIG. 2B schematically shows a detailed cross-sectional view of a radiation detector 190, according to an embodiment. The radiation detector 190 has an electrical insulator layer 198, a semiconductor layer 192 supported directly on the electrical insulator layer 198, and a through hole 194 in the semiconductor layer 192. A portion 197 of the semiconductor layer 192 extends into the through hole 194 and is surrounded by the through hole 194. The radiation detector 190 has semiconductor nanocrystals 196 in the through hole 194. The radiation detector 190 also has an electrode 199 in (e.g., through) the electrical insulator layer 198 and in electrical contact with the portion 197. The semiconductor layer 192 (including the portion 197), the semiconductor nanocrystals 196, the electrical insulator layer 198, and the electrode 199 may be in a radiation absorption layer 191.

The semiconductor layer 192 may have a semiconductor material such as silicon, germanium, GaAs, or a combination thereof. The semiconductor layer 192 may be an extrinsic semiconductor (i.e., doped with electron donors or electron acceptors).

The electrical insulator layer 198 may be an oxide, a nitride or an oxynitride or other suitable materials.

The portion 197 may be a cylinder or prism (e.g., rectangular prism or triangular prism). The portion 197 may have a height (i.e., a dimension in a direction perpendicular to the semiconductor layer 192) equal to, longer than or shorter than the height of the through hole 194. The portion 197 may have a height of a few micrometers.

In an embodiment, the semiconductor nanocrystals 196 may have a different composition from the semiconductor layer 192. Namely, the semiconductor nanocrystals 196 do not merely differ from the semiconductor layer 192 in terms of doping. The semiconductor nanocrystals 196 are not formed by doping the semiconductor layer 192. For example, if the semiconductor layer 192 is doped silicon, the semiconductor nanocrystals 196 are not doped silicon or intrinsic silicon.

Here, semiconductor nanocrystals 196 may refer to crystallite having diameters between about 1 nm and about 100 nm. In an embodiment, the semiconductor nanocrystals 196 may have diameters of 10 nanometer or less. The semiconductor nanocrystals 196 may be synthesized by various techniques that are known to the person having ordinary skill in the art. The semiconductor nanocrystals 196 may be in different shapes and orientations.

In an embodiment, the semiconductor nanocrystals 196 may be cadmium zinc telluride (CdZnTe) nanocrystals, cadmium telluride (CdTe) nanocrystals, cadmium selenide (CdSe) nanocrystals, cadmium sulfide (CdS) nanocrystals, or lead sulfide (PbS) nanocrystals, or another suitable nanocrystals that can absorb particles of radiation incident thereon and generate charge carriers. The semiconductor nanocrystals 196 may have a sufficient thickness and thus a sufficient absorbance (e.g., >80% or >90%) for incident particles of radiation of interest (e.g., X-ray photons). The semiconductor nanocrystals 196 are in electrical contact with the portion 197 and the rest of the semiconductor layer 192.

The electrode 199 may comprise an electrically conducting material such as a metal (e.g., gold, copper, aluminum, platinum, etc.), or any other suitable conducting materials (e.g., a doped semiconductor). The electrode 199 may be embedded in the electrical insulator layer 198 or may extend through the entire thickness of the electrical insulator layer 198.

When the radiation hits the radiation absorption layer 191, the semiconductor nanocrystals 196 may absorb the particles of radiation incident thereon and generate one or more charge carriers by a number of mechanisms. A particle of the radiation may generate 1 to 100000 charge carriers. The charge carriers may comprise electrons and holes. The charge carriers may drift to a sidewall 194*b* of the through hole 194 and the portion 197 under an electric field between the portion 197 and the rest of the semiconductor layer 192. For example, the holes may drift to the sidewall 194*b*, and the electrons may drift to the portion 197.

The electronics layer 120 may include an electronic system 121 configured to process electrical signals on the portion 197 generated from the charge carriers collected. The electronic system 121 may include an analog circuitry such as a filter network, amplifiers, integrators, and comparators, or a digital circuitry such as a microprocessor, and memory. The electronic system 121 may include one or more ADCs. The electronic system 121 may be electrically connected to the portion 197 through a via 131 and the electrode 199. Space among the vias may be filled with a filler material 130, which may increase the mechanical stability of the connection of the electronics layer 120 to the radiation absorption layer 191. Other bonding techniques are possible to connect the electronic system 121 to the portion 197 without using vias.

The recess 104 of FIG. 2A and the through hole 194 of FIG. 2B may have a shape of a frustum, prism, pyramid, cuboid, cubic, cylinder or other suitable shapes. The radiation detector 100 of FIG. 2A or the radiation detector 190 of FIG. 2B may have multiple copies of recess 104 or through holes 194 respectively, which may be arranged into an array such as a rectangular array, a honeycomb array, a hexagonal array or any other suitable array.

Figure 2D:
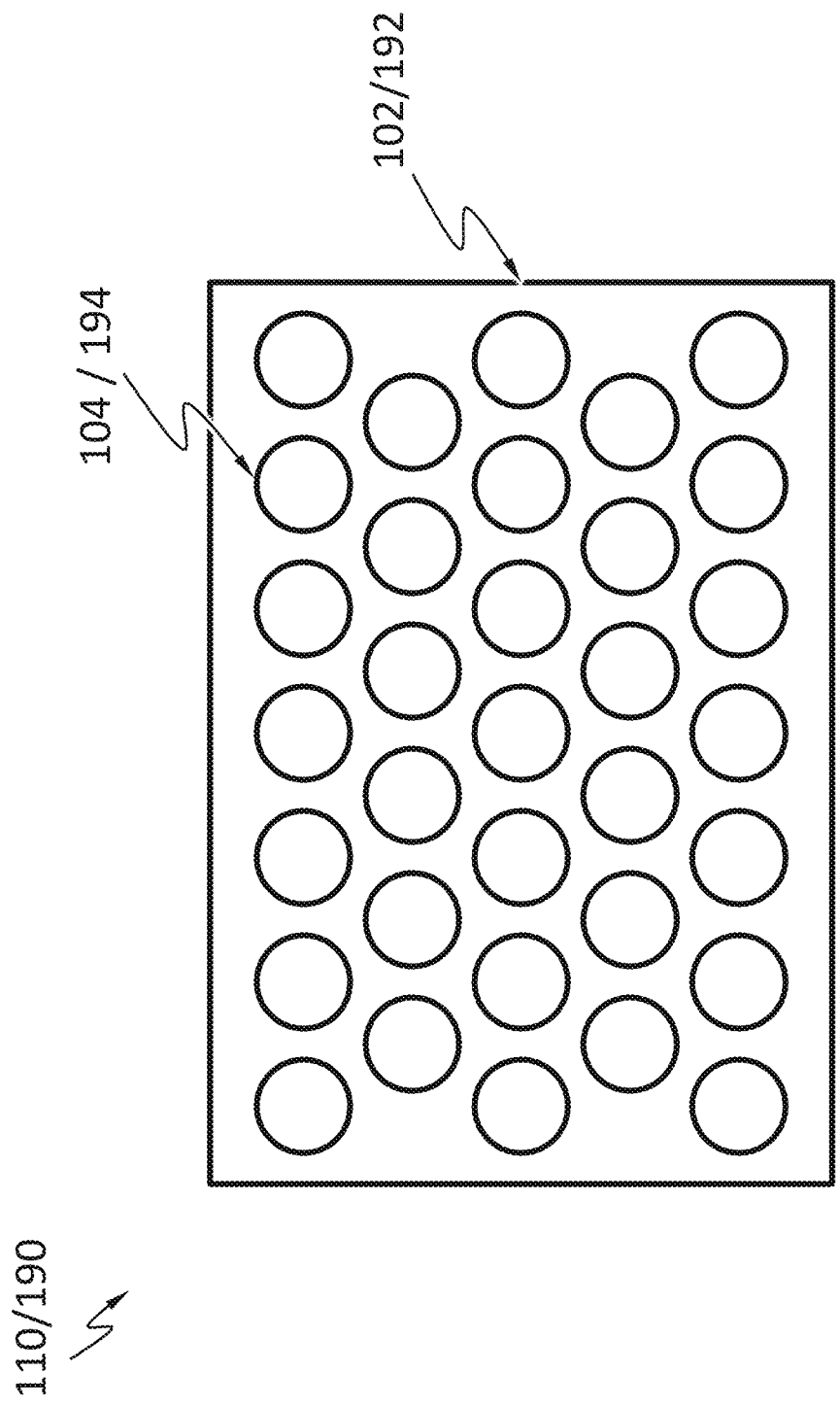

FIG. 2C-FIG. 2E schematically show top views of several examples of the radiation detector 100 or 190 with copies of the recess 104 or the through holes 194, with various shapes and arrangements. The spacing between the copies (e.g., the shortest distance between the perimeters of neighboring copies) may be less than 10 μm, less than 20 μm, or less than 30 μm. Each of the copies may have a surface area in the range of 1-10000 μm² or any other suitable size.

Figure 3:
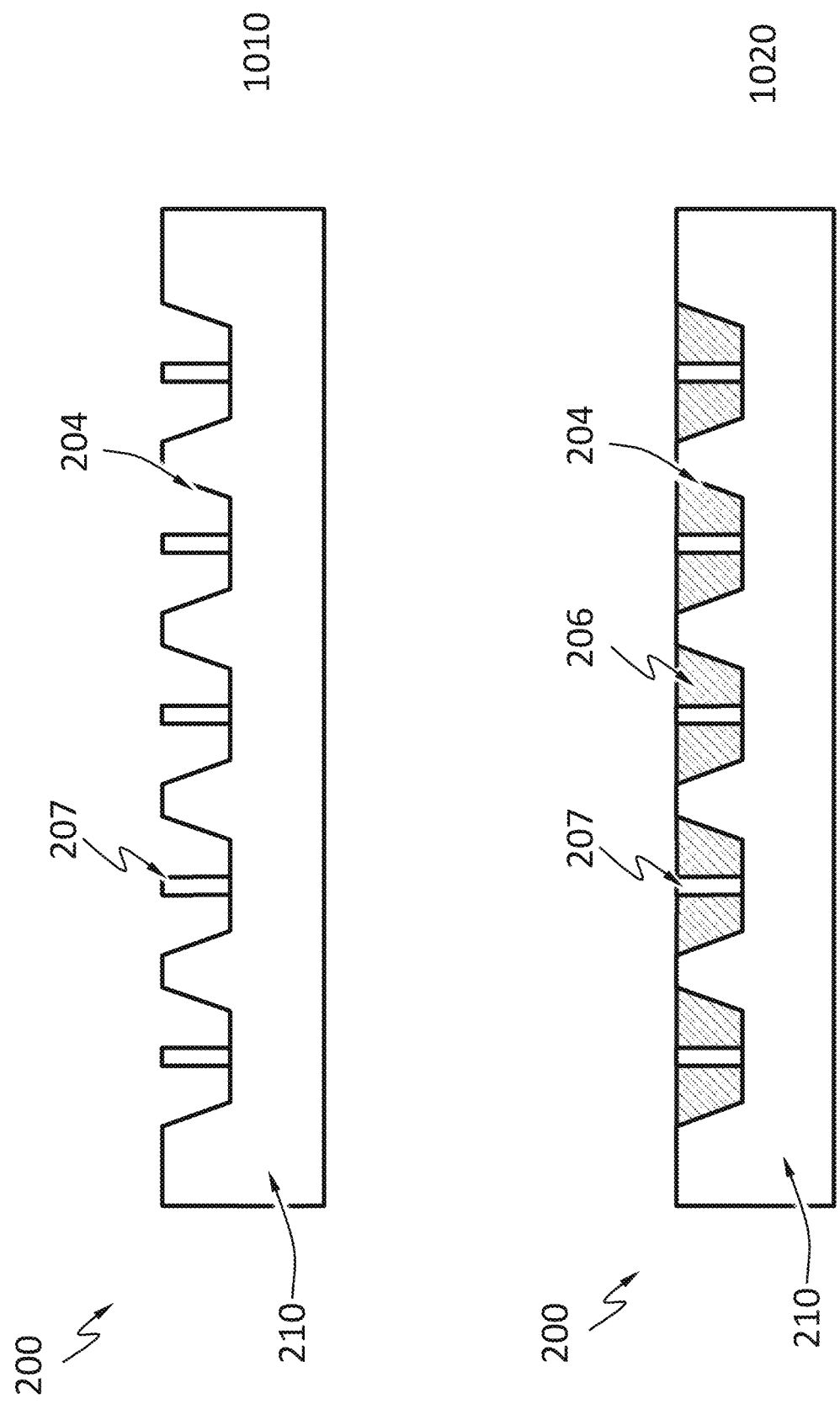
FIG. 3 schematically illustrates a process of forming the radiation absorption layer in FIG. 2A, according to an embodiment.
Figure 3:
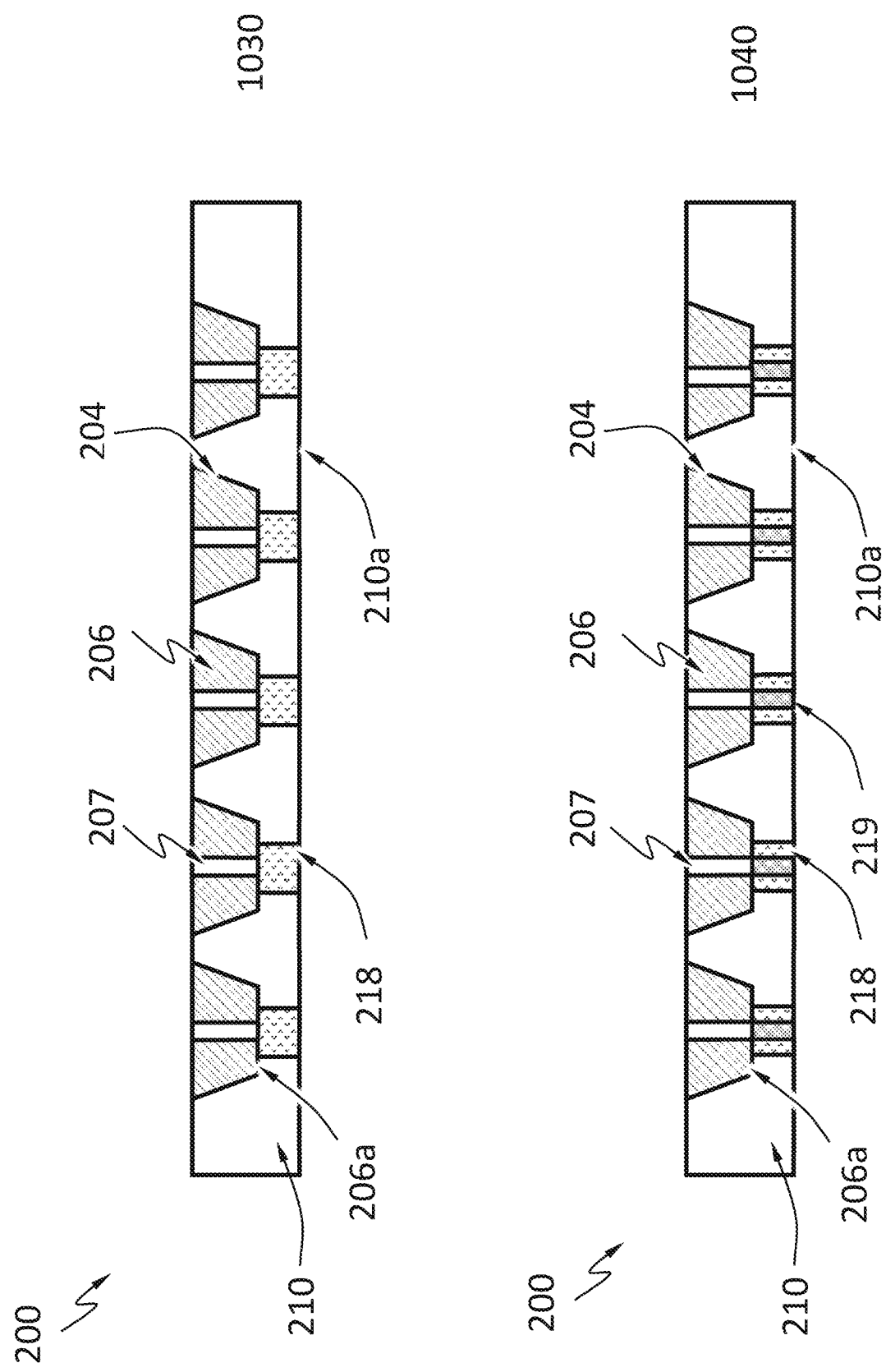

FIG. 3 schematically illustrates a process of forming a radiation absorption layer 200, according to an embodiment.

In step 1010, a recess 204 is formed into a semiconductor substrate 210, according to an embodiment. A portion 207 of the semiconductor substrate 210 extends into the recess 204 and the portion 207 is surrounded by the recess 204. The recess 204 may function as the recess 104 in FIG. 2A. The portions 207 may function as the portion 107 in FIG. 2A.

In step 1020, semiconductor nanocrystals 206 are formed in the recess 204, according to an embodiment. The semiconductor nanocrystals 206 may have a different composition from the semiconductor substrate 210. Namely, the semiconductor nanocrystals 206 do not merely differ from the semiconductor substrate 210 in terms of doping. The semiconductor nanocrystals 206 may function as the semiconductor nanocrystals 106 of the radiation absorption layer 110 in FIG. 2A. There are various ways to form semiconductor nanocrystals 206 in the recess 204. For example, colloidal synthesis is one method to prepare semiconductor nanocrystals.

In step 1030, a first doped semiconductor region 218 is formed in the semiconductor substrate 210, according to an embodiment.

In step 1040, a second doped semiconductor region 219 is formed in the semiconductor substrate 210, according to an embodiment. The first doped semiconductor region 218 and the second doped semiconductor region 219 form a p-n junction that separates the portion 207 from the rest of the semiconductor substrate 210. The first doped semiconductor region 218 may surround the second doped semiconductor region 219. The second doped semiconductor region 219 may be in electrical contact with the portion 207.

In an embodiment, the second doped semiconductor region 219 may be formed by doping a portion of the first doped semiconductor region 218. The first doped semiconductor region 218 may be formed by doping with p type or n type dopants in the semiconductor substrate 210. The first doped semiconductor region 218 may extend from a surface 210a of the semiconductor substrate 210 to an interface 206a between the recess 204 and the semiconductor substrate 210. The second doped semiconductor region 219 may be coextensive with the first doped semiconductor region 218. The second doped semiconductor region 219 may be formed by doping with p type or n type dopants in the semiconductor substrate 210 and the dopants used are opposite from the ones used in forming the first doped semiconductor region 218. For example, if the first doped semiconductor region 218 is formed by doping the semiconductor substrate 210 with p type dopant, the second doped semiconductor region 219 is formed by doping with n type dopant, or vice versa.

Figure 4:
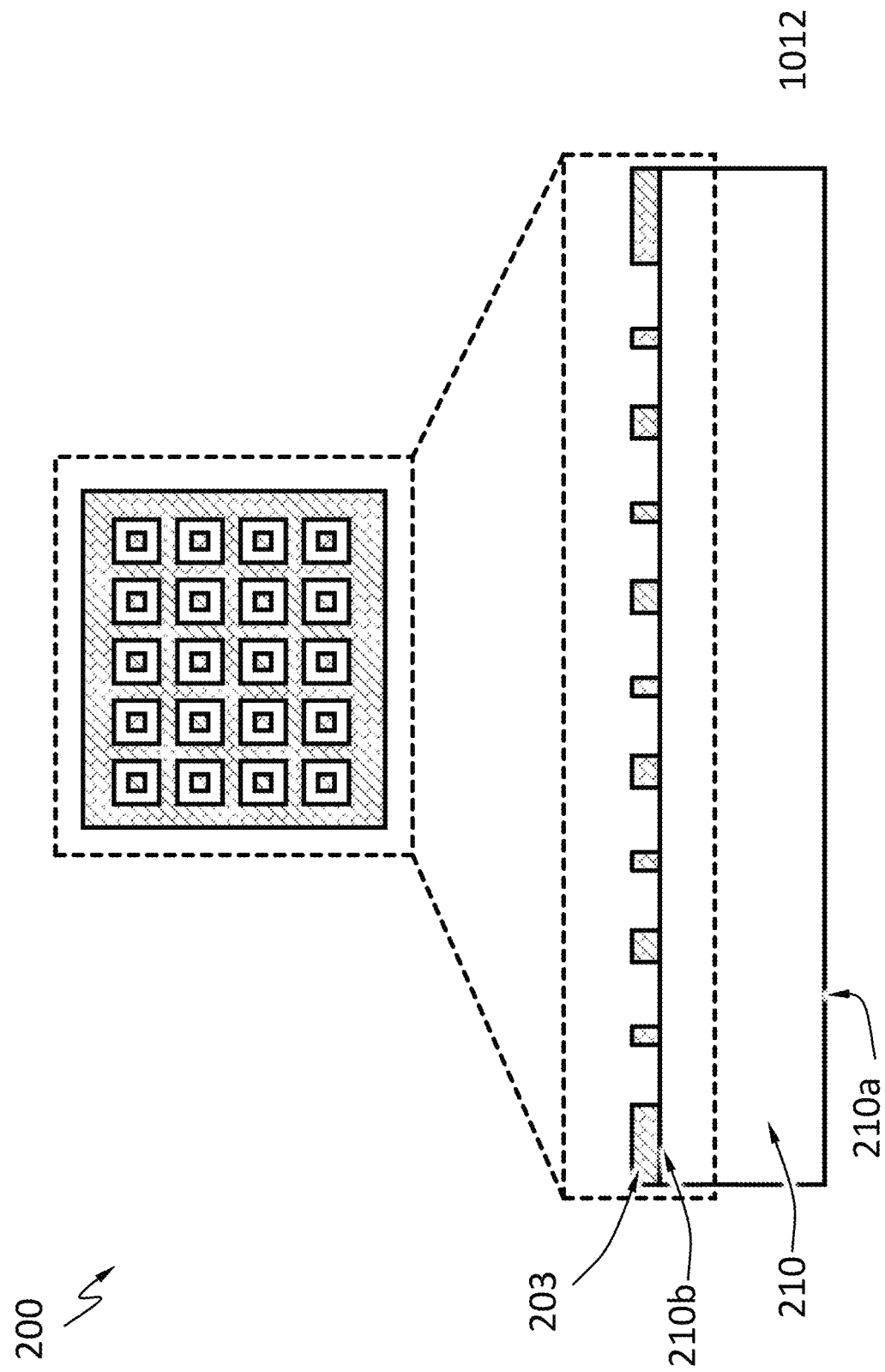
FIG. 4 schematically illustrates a process of forming recess of the radiation absorption layer in FIG. 2A, according to an embodiment.
Figure 4:
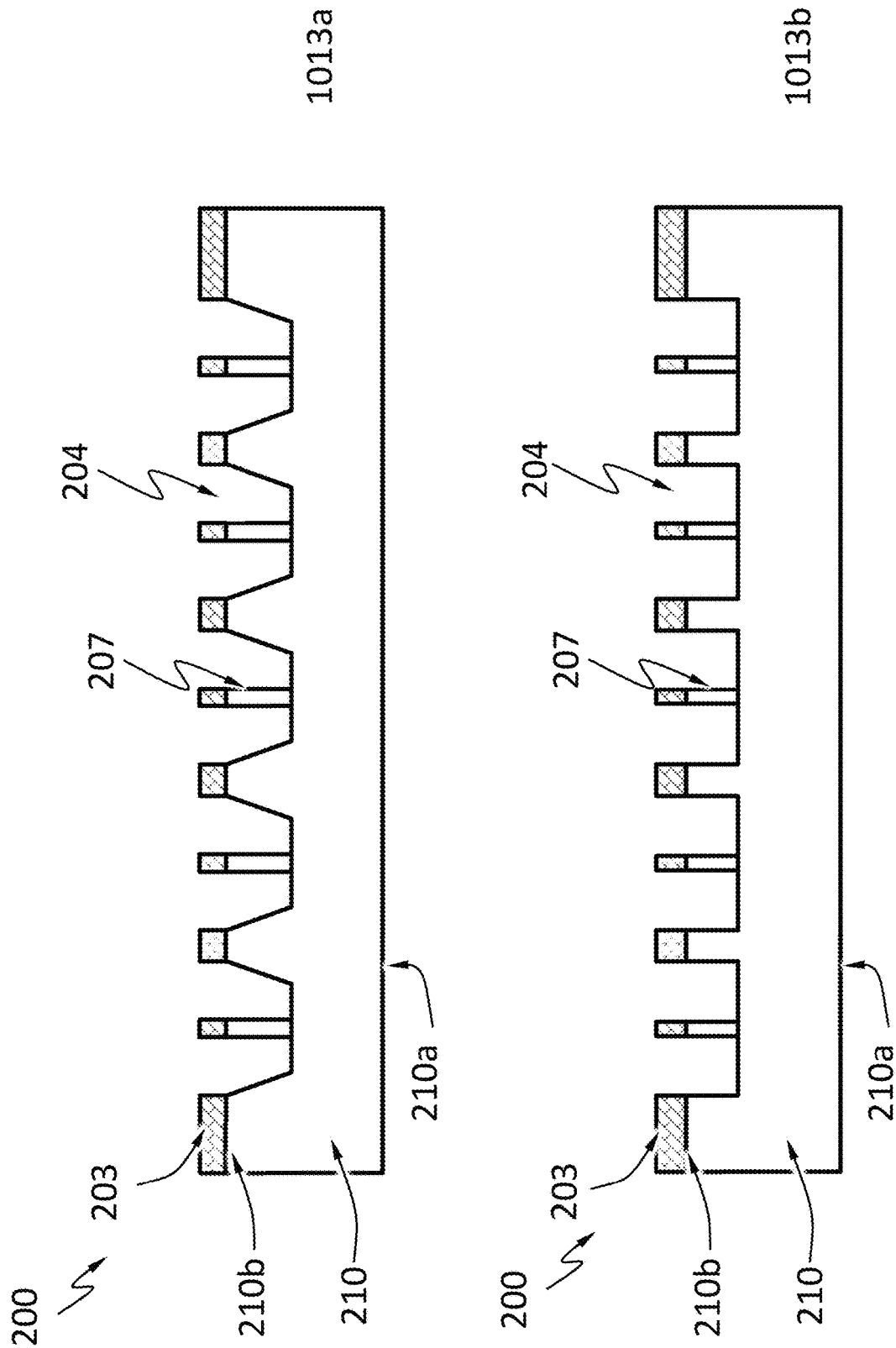
Figure 4:
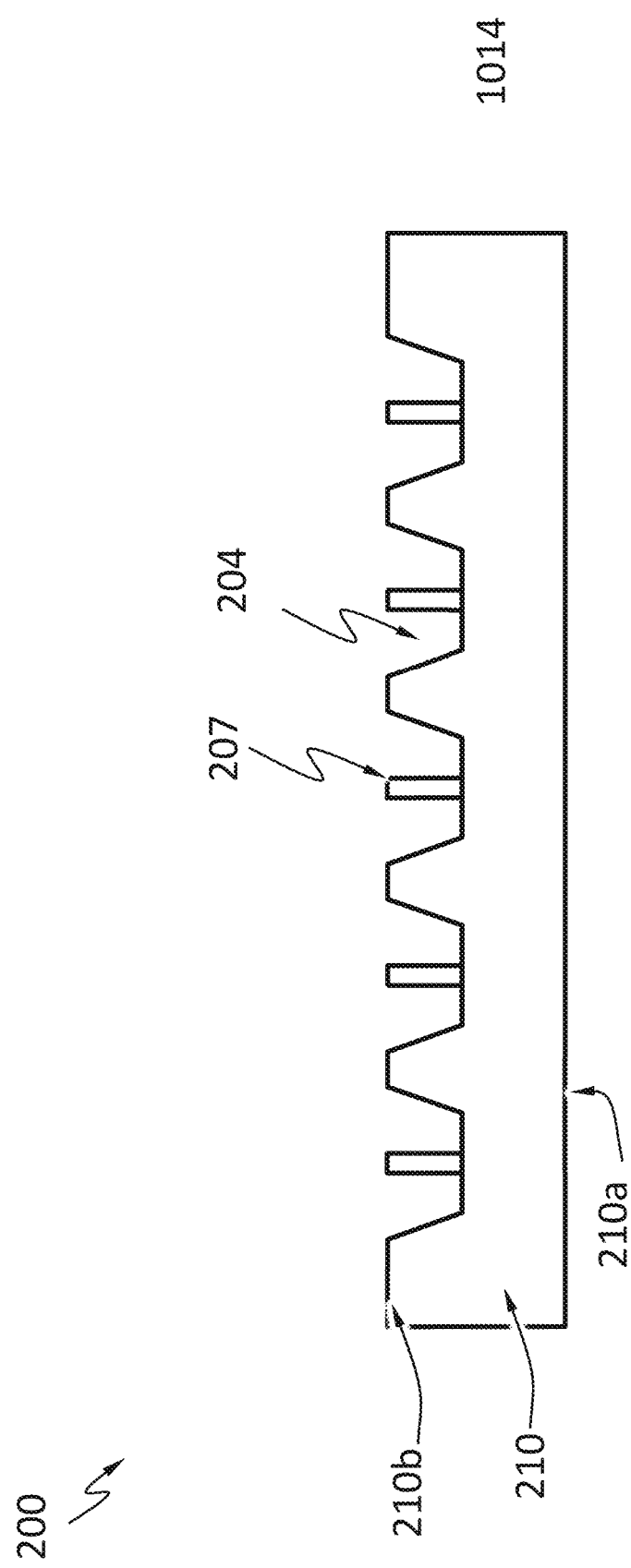

In an embodiment, forming the recess 204 may comprise forming a mask 203 on the semiconductor substrate 210 and etching an area of the semiconductor substrate 210 uncovered by the mask 203, as shown in step 1011-1014 of FIG. 4. The mask 203 may be formed onto a surface 210b of the semiconductor substrate 210 and the semiconductor substrate 210 may include a semiconductor material such as, silicon, germanium, GaAs, or a combination thereof. The mask 203 may serve as an etch mask for forming the recess 204 as shown in step 1013a or step 1013b. The mask 203 may comprise a material such as silicon dioxide, silicon nitride, or metals (e.g., aluminum, chromium). The thickness of the mask 203 may be determined according to the depth of the recess 204 and etching selectivity (i.e., ratio of etching rates of the mask 203 and the semiconductor substrate 210). In an embodiment, the mask 203 may have a thickness of a few microns. The mask 203 may be formed onto the surface 210b by various techniques, such as physical vapor deposition, chemical vapor deposition, spin coating, sputtering or any other suitable processes.

In step 1012, the mask 203 is patterned to have openings in which the semiconductor substrate 210 is exposed, shown from a cross-sectional view. Shapes and locations of the openings correspond to the footprint shapes and locations of the recess 204 and other recesses to be formed in step 1013a or step 1013b. If the openings have a square shape (as shown in the top view in step 1012) and are arranged into a rectangular array, the recess 204 and the other recesses also have a square shape in their footprint and are arranged into a rectangular array. The pattern formation on the mask 203 may involve lithography process or any other suitable processes. For example, a resist layer may be first deposited (e.g., by spin coating) onto the surface of the mask 203, and lithography is followed to form the openings. The resolution of the lithography is limited by the wavelength of the radiation used. Photolithography tools using deep ultraviolet (DUV) light with wavelengths of approximately 248 and 193 nm, allows minimum feature sizes down to about 50 nm. E-beam lithography tools using electron energy of 1 keV to 50 keV allows minimum feature sizes down to a few nanometers. In step 1013a or step 1013b, the recess 204 and the other recesses may be formed into the surface 210b of the semiconductor substrate 210 by etching portions of the semiconductor substrate 210 uncovered by the mask 203 to a desired depth. The height of the portions 207 may be lower or equal to the depth of the recess 204. The recess 204 may have a shape of a frustum, prism, pyramid, cuboid, cubic or cylinder. In example of step 1013a, the recess 204 and the other recesses have a pyramid shape; and in example of step 1013b, the recess 204 and the other recesses have a cuboid shape. The recess 204 may have a smooth surface.

In an embodiment, etching the portions of the semiconductor substrate 210 may be carried out by wet etching, dry etching or a combination thereof. Wet etching is a type of etching processes using liquid-phase etchants. The semiconductor substrate 210 may be immersed in a bath of etchant, and areas not protected by the masks may be removed. The dimensions and shape of the recess 204 and the other recesses may be defined not only by dimensions and shape of the openings of the mask 203, but also material of the semiconductor substrate 210, liquid chemicals or etchants used, etching rate and duration, etc. In an embodiment, the semiconductor substrate 210 may be a silicon substrate, and the recess 204 and the other recesses may be formed by anisotropic wet etching with etchants such as potassium hydroxide (KOH), ethylenediamine pyrocatechol (EDP), tetramethylammonium hydroxide (TMAH), etc. During an anisotropic wet etching of the silicon substrate, liquid etchants may etch the silicon substrate at different rates depending upon the silicon crystalline plane exposed to the etchants, so that the recess 204 and the other recesses with different shapes and dimensions may be formed. In example of step 1013a, when the surface 210a is a (100) silicon crystallographic plane, using wet etchants such as KOH can form a pyramidal-shaped recess 204 with flat and angled etched walls. In example of step 1013b, when the surface 210a is a (110) silicon crystallographic plane, using wet etchants such as KOH can form a cuboidal-shaped recess 204 instead.

In step 1014, the mask 203 may be removed after forming the recess 204 and the other recesses by wet etching, chemical mechanical polishing or some other suitable techniques, according to an embodiment.

Figure 5:
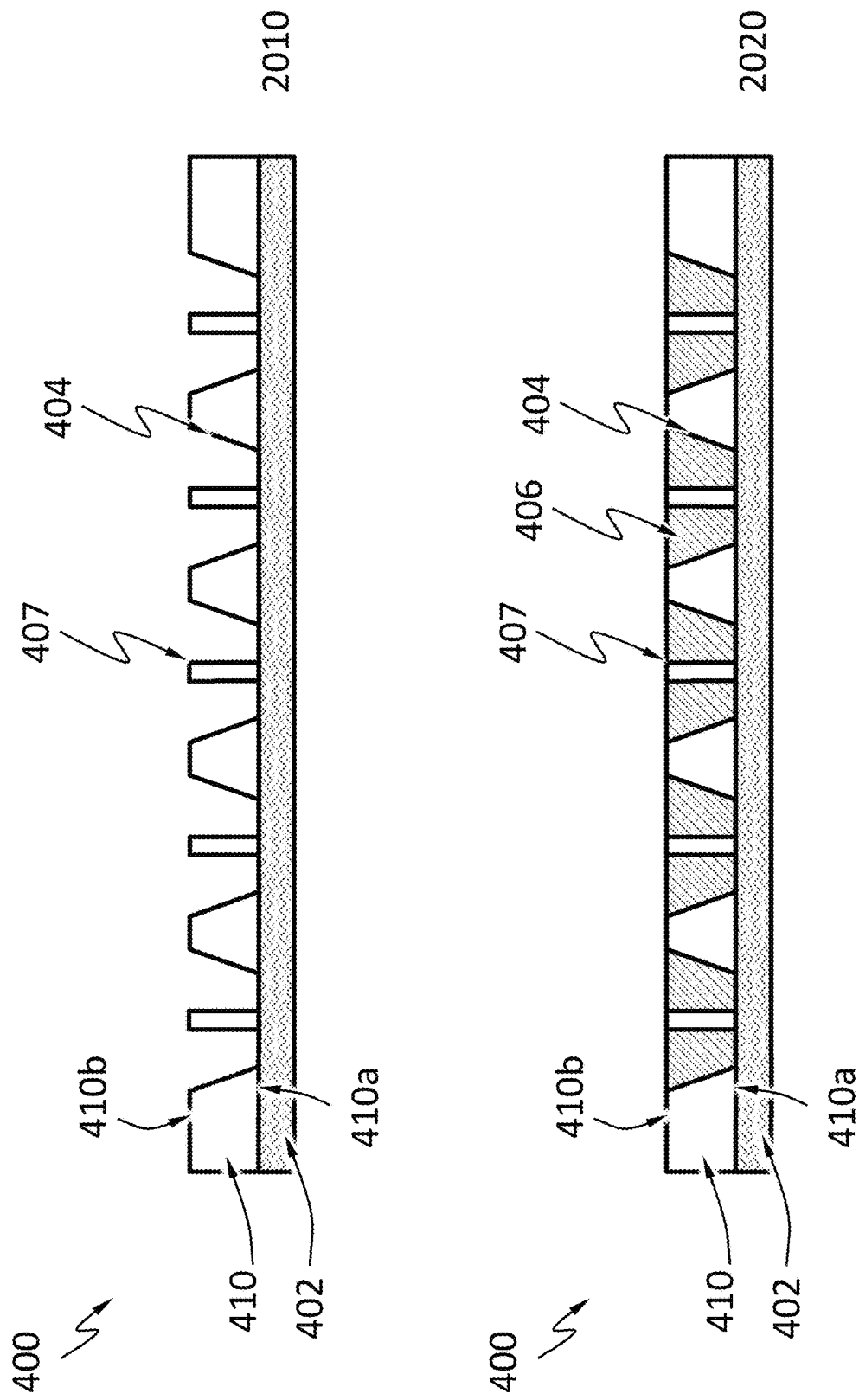
FIG. 5 schematically illustrates a process of forming the radiation absorption layer in FIG. 2B, according to an embodiment.
Figure 5:
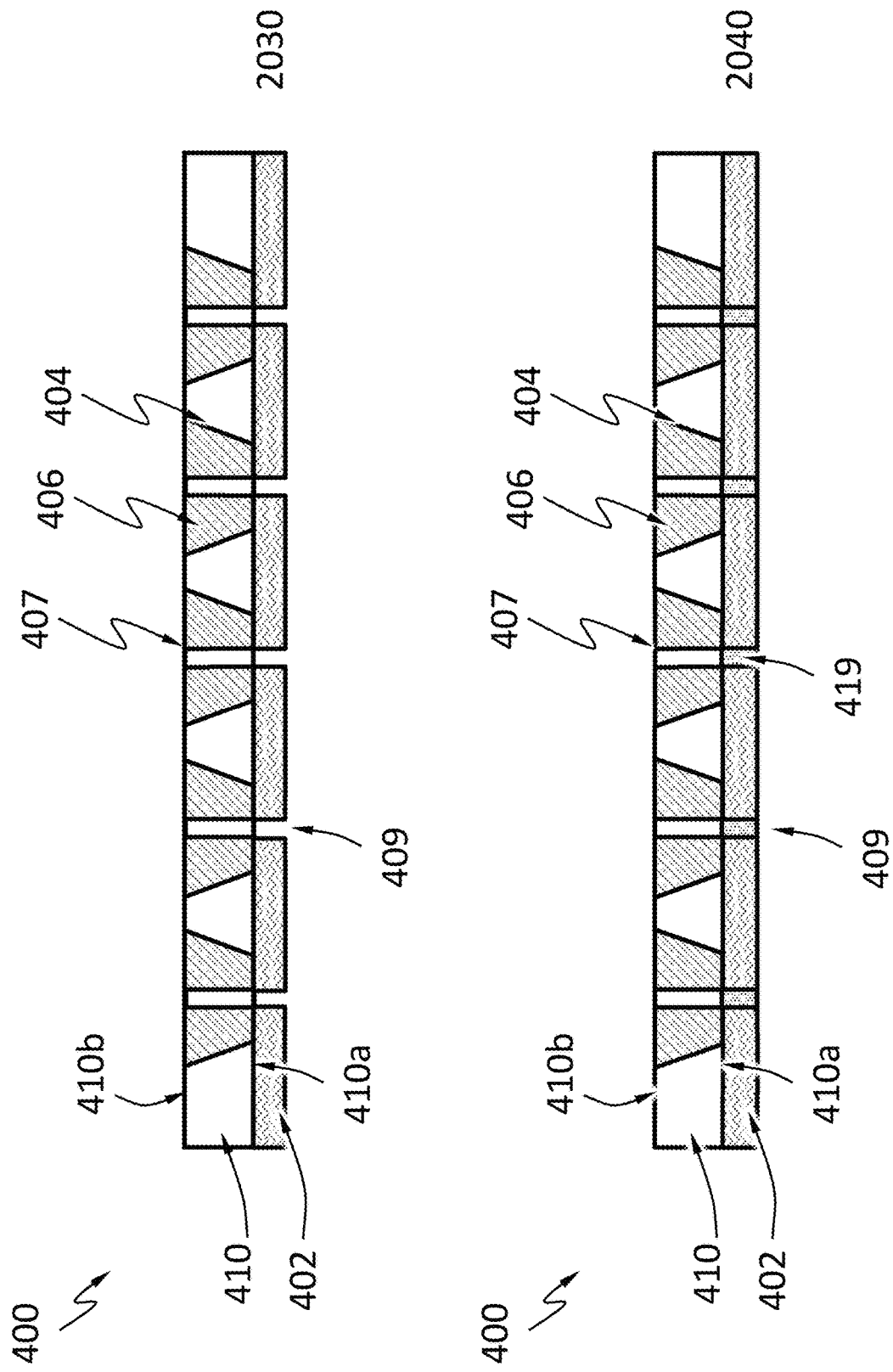

FIG. 5 schematically illustrates a process of forming a radiation absorption layer 400, according to an embodiment.

In step 2010, a through hole 404 is formed in a semiconductor layer 410, where the semiconductor layer 410 is supported directly on an electrical insulator layer 402. A portion 407 of the semiconductor layer 410 remains in and is surrounded by the through hole 404. Because the through hole 404 may extend through the entire thickness of the semiconductor layer 410, the portion 407 and the rest of the semiconductor layer 410 are electrically isolated at the conclusion of step 2010. The electrical insulator layer 402 may function as the electrical insulator layer 198 in FIG. 2B. The through hole 404 may function as the through hole 194 in FIG. 2B. The portion 407 may function as the portion 197 in FIG. 2B.

In step 2020, semiconductor nanocrystals 406 are formed in the through hole 404, according to an embodiment. The semiconductor nanocrystals 406 have a different composition from the semiconductor layer 410. The semiconductor nanocrystals 406 may function as the semiconductor nanocrystals 196 in FIG. 2B. There are various ways to form semiconductor nanocrystals 406 in the through hole 404. For example, colloidal synthesis is one method to prepare semiconductor nanocrystals in the industry.

In step 2030, an opening 409 is formed through the electrical insulator layer 402 so that the portion 407 is exposed in the opening 409, according to an embodiment.

In step 2040, an electrode 419 is formed in the opening 409, according to an embodiment. The electrode 419 is in electrical contact to the portion 407. The electrode may function as the electrode 199 in FIG. 2B.

Figure 6:
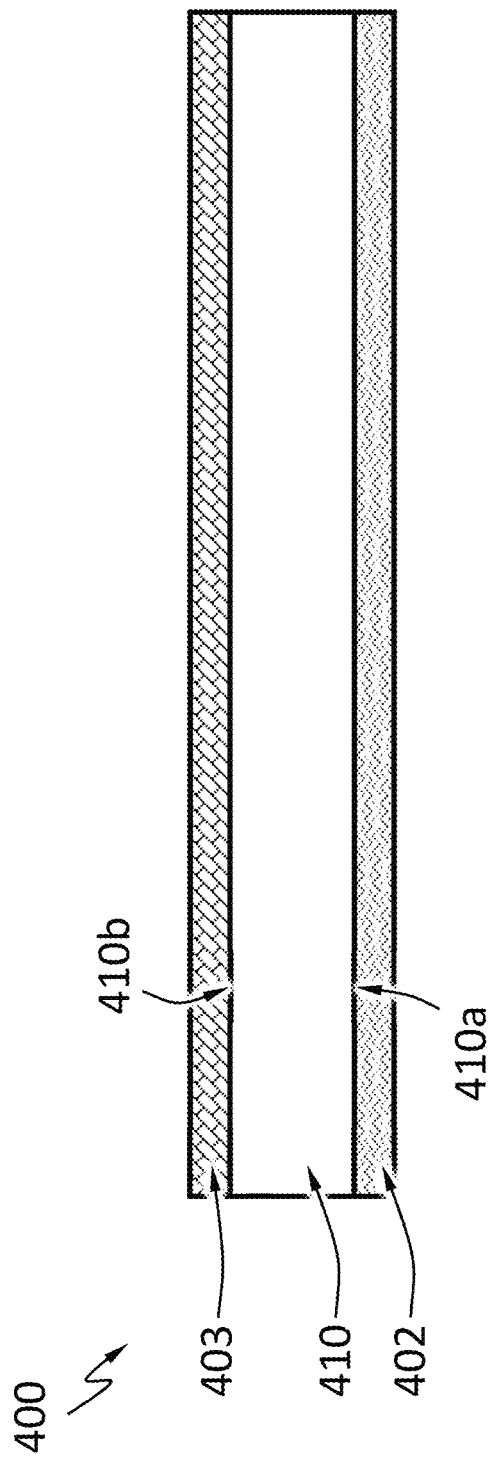
FIG. 6 schematically illustrates a process of forming through hole of the radiation absorption layer in FIG. 2B, according to an embodiment.
Figure 6:
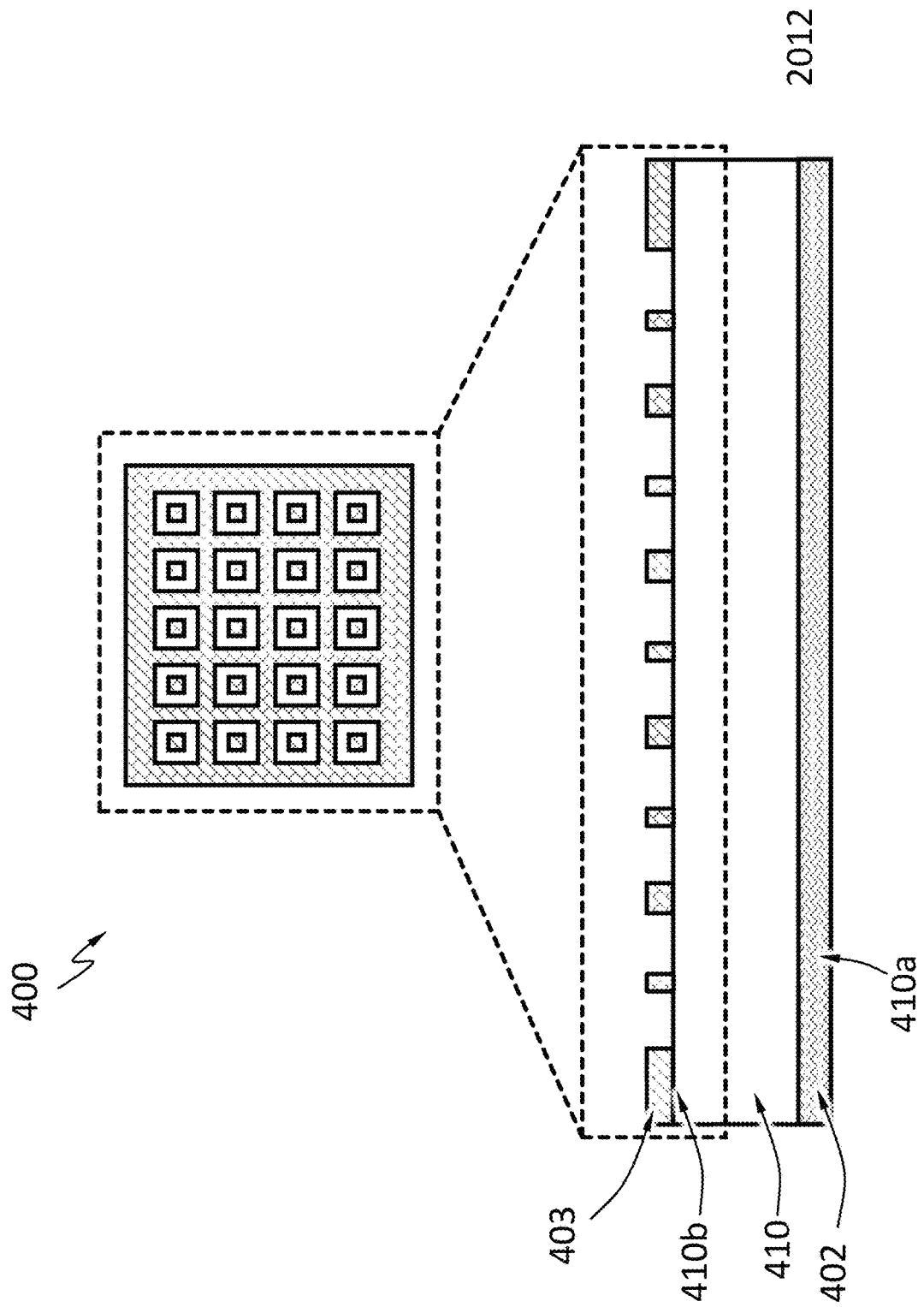
Figure 6:
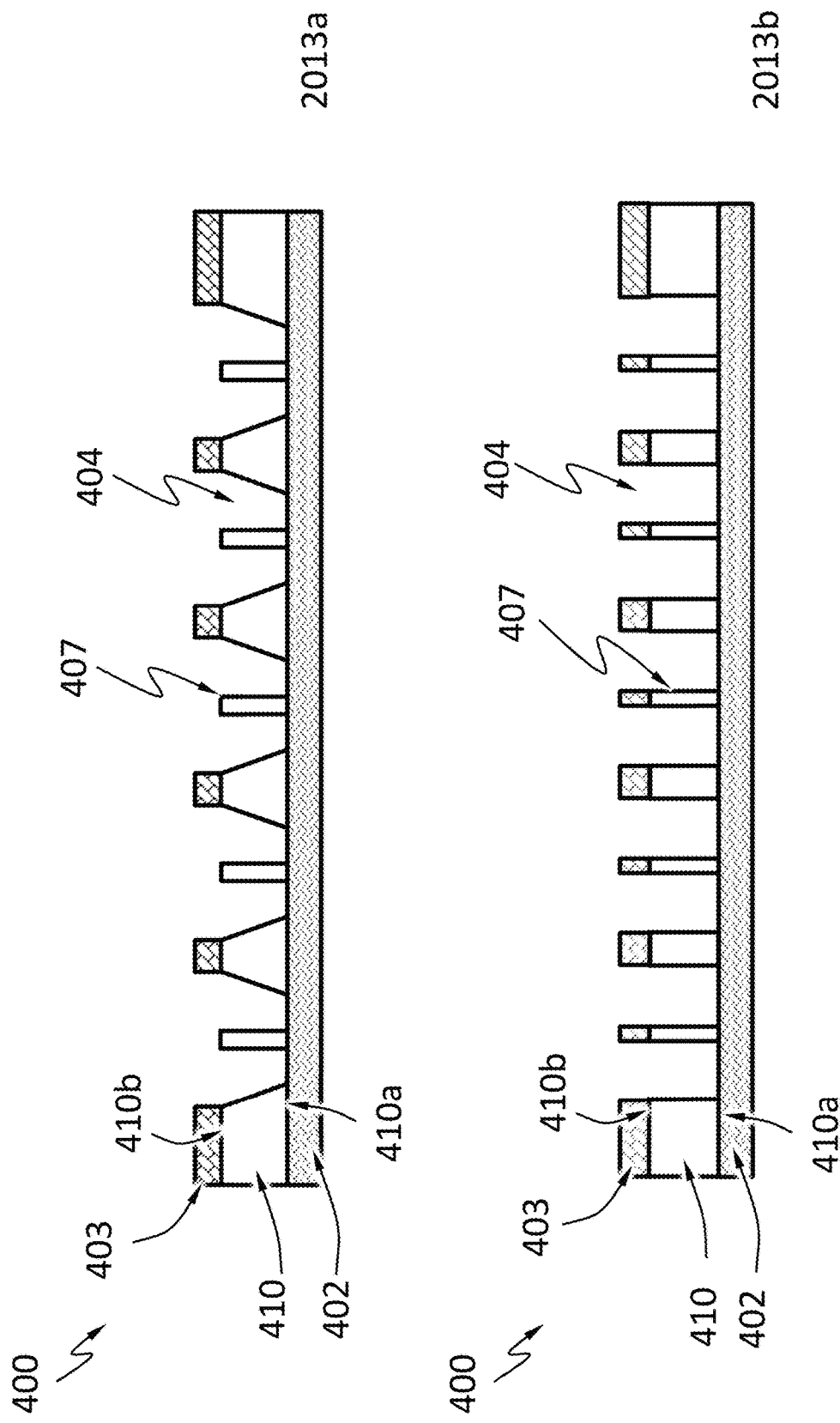
Figure 6:
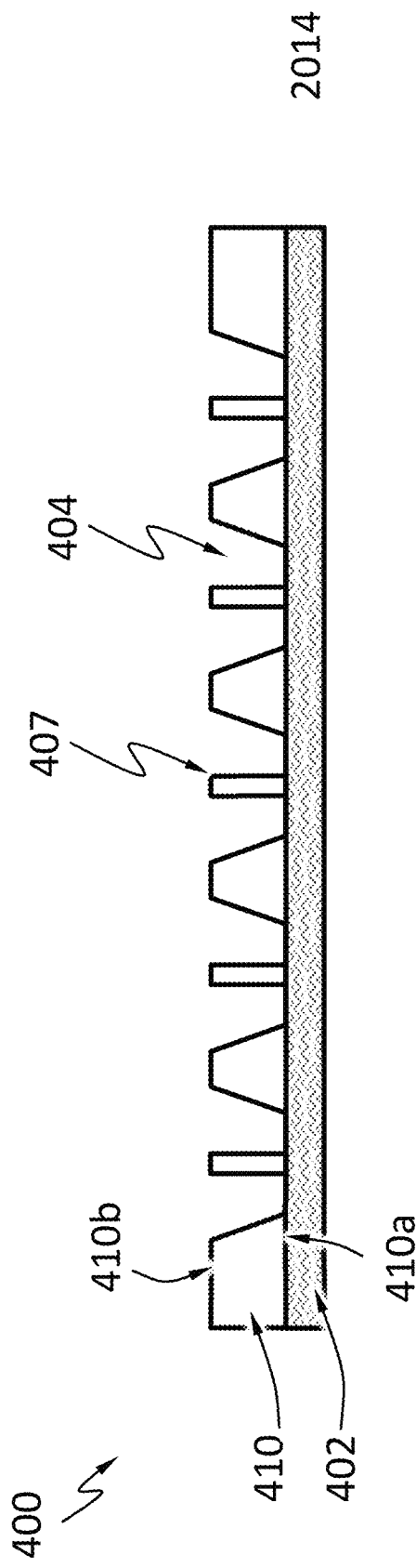

In an embodiment, forming the through hole 404 in a semiconductor layer 410 may comprise forming a mask 403 on the semiconductor substrate 210 and etching an area of the semiconductor layer 410 uncovered by the mask 403, as shown in step 2011-2014 of FIG. 6. The mask 403 may be formed onto a surface 410b of the semiconductor layer 410 and the semiconductor layer 410 may include a semiconductor material such as, silicon, germanium, GaAs, or a combination thereof. The mask 403 may serve as an etch mask for forming the through hole 404 and other through holes as shown in step 2013a or step 2013b. The mask 403 may comprise a material such as silicon dioxide, silicon nitride, carbon, or metals (e.g., aluminum, chromium). The thickness of the mask 403 may be determined according to the depth of the through hole 404 and the other through holes and etching selectivity (i.e., ratio of etching rates of the mask 403 and the semiconductor layer 410). In an embodiment, the mask 403 may have a thickness of a few microns. The mask 403 may be formed onto the surface 410b by various techniques, such as physical vapor deposition, chemical vapor deposition, spin coating, sputtering or any other suitable processes.

In step 2012, the mask 403 is patterned to have openings in which the semiconductor layer 410 is exposed, shown from a cross-sectional view. Shapes and locations of the openings correspond to the footprint shapes and locations of the through hole 404 and the other through holes to be formed in step 2013a or step 2013b. If the openings have a square shape (as shown in the top view in step 2012) and are arranged into a rectangular array, the through hole 404 and the other through holes also have a square shape in their footprint and are arranged into a rectangular array. The pattern formation on the mask 403 may involve lithography process or any other suitable processes. For example, a resist layer may be first deposited (e.g., by spin coating) onto the surface of the mask 403, and lithography is followed to form the openings. The resolution of the lithography is limited by the wavelength of the radiation used. Photolithography tools using deep ultraviolet (DUV) light with wavelengths of approximately 248 and 193 nm, allows minimum feature sizes down to about 50 nm. E-beam lithography tools using electron energy of 1 keV to 50 keV allows minimum feature sizes down to a few nanometers.

In step 2013a or step 2013b, the through hole 404 and the other through holes may be formed into the surface 410b of the semiconductor layer 410 by etching portions of the semiconductor layer 410 uncovered by the mask 403 to a desired depth. The height of the portion 407 may be lower or equal to the depth of the through hole 404. The through hole 404 may have a shape of a frustum, prism, pyramid, cuboid, cubic or cylinder. In example of step 2013a, the through hole 404 has a pyramid shape; and in example of step 2013b, the through hole 404 has a cuboid shape. The through hole 404 may have a smooth surface.

In an embodiment, etching the portions of the semiconductor layer 410 may be carried out by wet etching, dry etching or a combination thereof. Wet etching is a type of etching processes using liquid-phase etchants. The semiconductor layer 410 may be immersed in a bath of etchant, and areas not protected by the masks may be removed. The dimensions and shape of the through hole 404 and the other through holes may be defined not only by dimensions and shape of the openings of the mask 403, but also material of the semiconductor layer 410, liquid chemicals or etchants used, etching rate and duration, etc. In an embodiment, the semiconductor layer 410 may be a silicon substrate, and the through hole 404 and the other through holes may be formed by anisotropic wet etching with etchants such as potassium hydroxide (KOH), ethylenediamine pyrocatechol (EDP), tetramethylammonium hydroxide (TMAH), etc. During an anisotropic wet etching of the silicon substrate, liquid etchants may etch the silicon substrate at different rates depending upon the silicon crystalline plane exposed to the etchants, so that the through hole 404 and the other through holes with different shapes and dimensions may be formed. In example of step 2013a, when the surface 410b is a (100)

silicon crystallographic plane, using wet etchants such as KOH can form pyramidal-shaped through hole 404 with flat and angled etched walls. In example of step 2013b, when the surface 410b is a (110) silicon crystallographic plane, using wet etchants such as KOH can form cuboidal-shaped through hole 404 instead.

In step 2014, the mask 403 may be removed after forming the through hole 404 and the other through holes by wet etching, chemical mechanical polishing or some other suitable techniques, according to an embodiment.

Figure 7A:
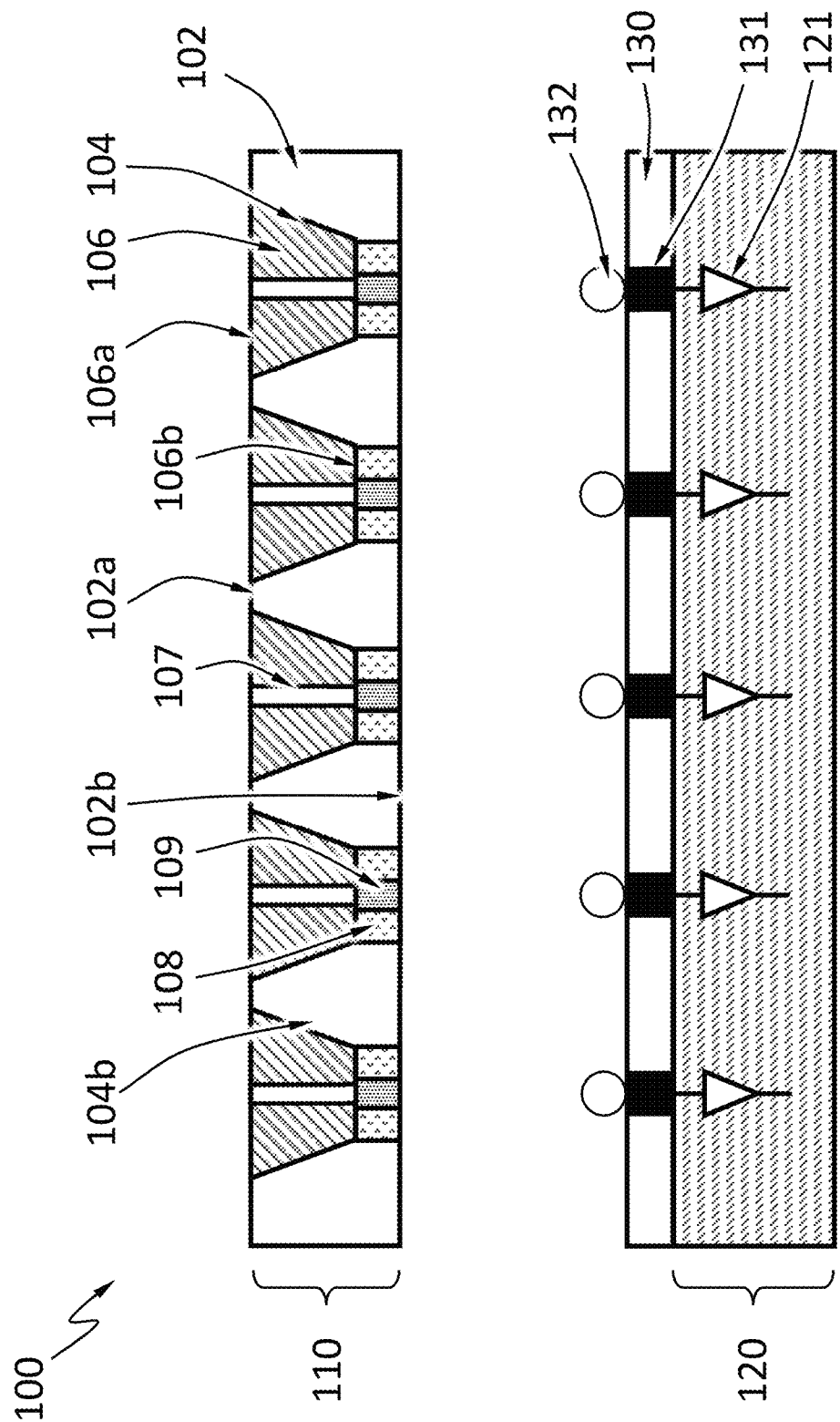
FIG. 7A and FIG. 7B each schematically illustrates bonding between the radiation absorption layer and the electronics layer to form the radiation detector as shown respectively in FIG. 2A and FIG. 2B, according an embodiment.

FIG. 7A schematically illustrates a process of bonding the semiconductor substrate 102 and an electronics layer 120 as shown in FIG. 2A. The electronics layer 120 may comprise an electronic system that is electronically connected to the second doped semiconductor region 109 and configured to process an electrical signal generated in the radiation absorption layer 110. The second doped semiconductor region 109 as shown may bond to each of the vias 131 by a suitable technique such as direct bonding or flip chip bonding.

Figure 7B:
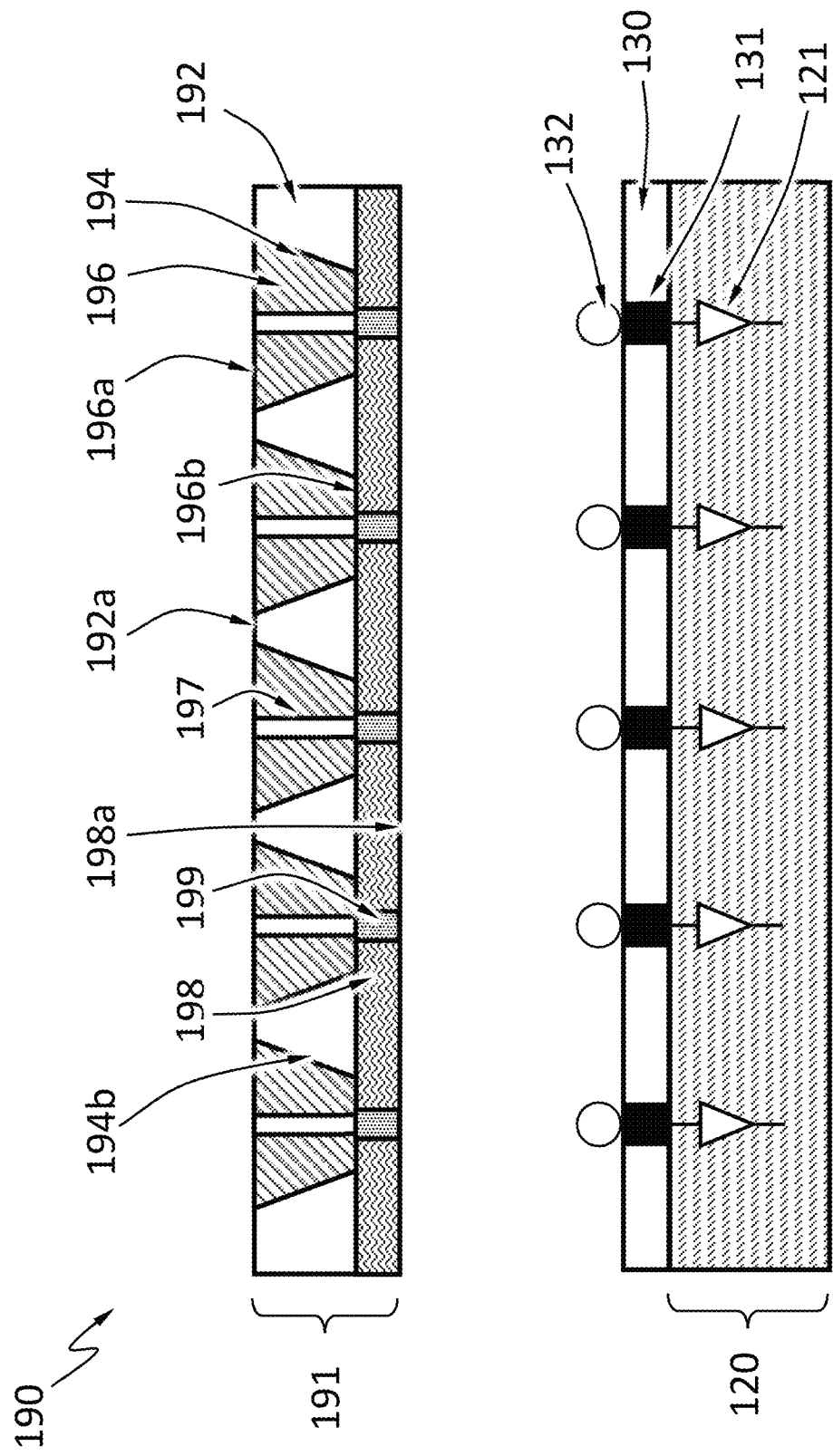

FIG. 7B schematically illustrates a process of bonding the electrical insulator layer 198 to an electronics layer 120 as shown in FIG. 2B. The electronics layer 120 may comprise an electronic system 121 electrically connected to the electrode 199 and configured to process an electrical signal generated in the radiation absorption layer 191. The electrode 199 as shown may bond to each of the vias 131 by a suitable technique such as direct bonding or flip chip bonding Direct bonding is a wafer bonding process without any additional intermediate layers (e.g., solder bumps). The bonding process is based on chemical bonds between two surfaces. Direct bonding may be at elevated temperature but not necessarily so.

Flip chip bonding uses solder bumps 132 deposited onto contact pads (e.g., the second doped semiconductor region 109 or electrode 199, or contacting surfaces of the vias 131). Either the radiation absorption layer 110 or 191, or the electronics layer 120 is flipped over and the second doped semiconductor region 109 or electrode 199 are aligned to the vias 131. The solder bumps 132 may be melted to solder the second doped semiconductor region 109 or electrode 199 and the vias 131 together. Any void space among the solder bumps 132 may be filled with an insulating material.

Figure 8A:
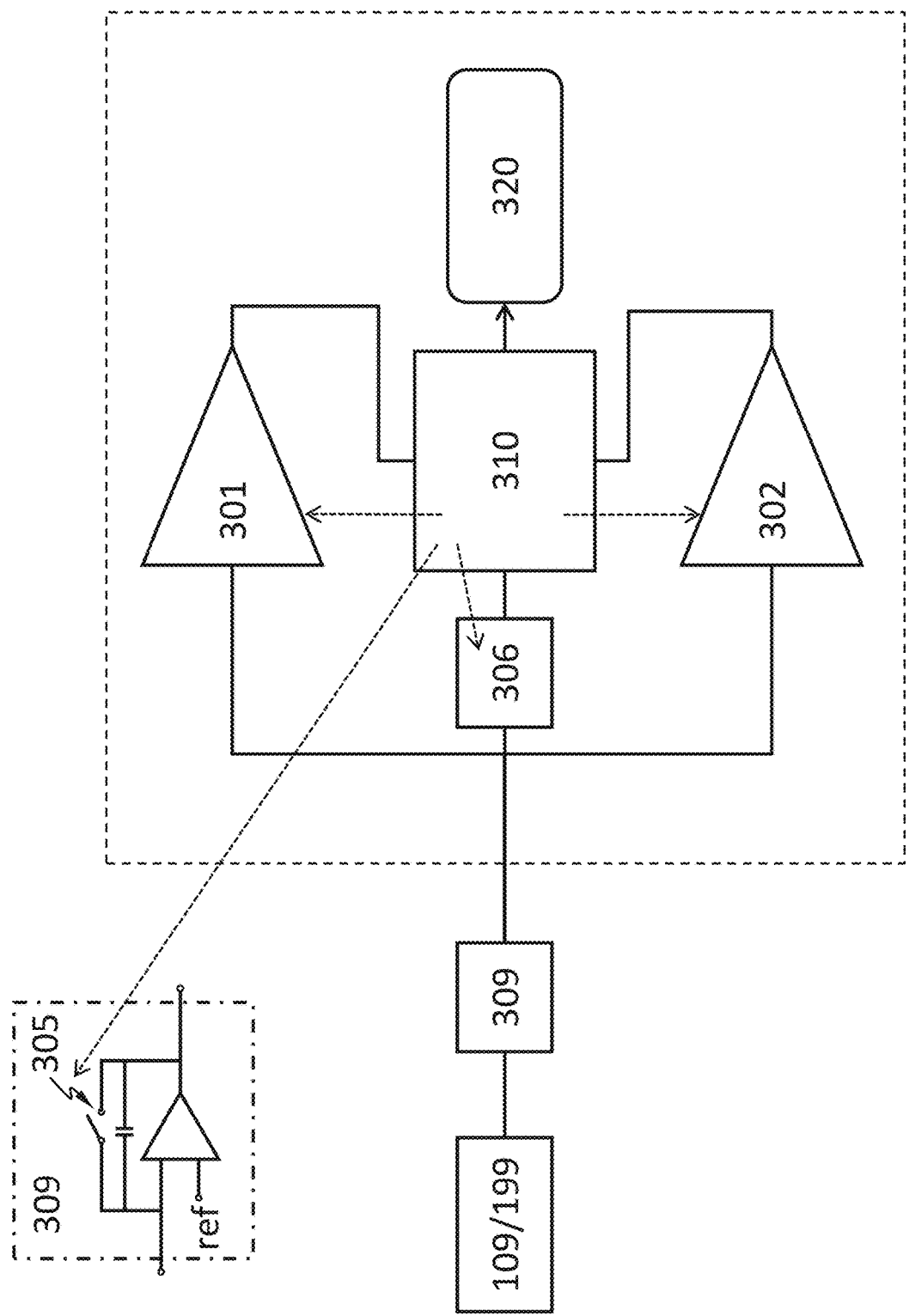
FIG. 8A and FIG. 8B each show a component diagram of the electronic system, according to an embodiment.
Figure 8B:
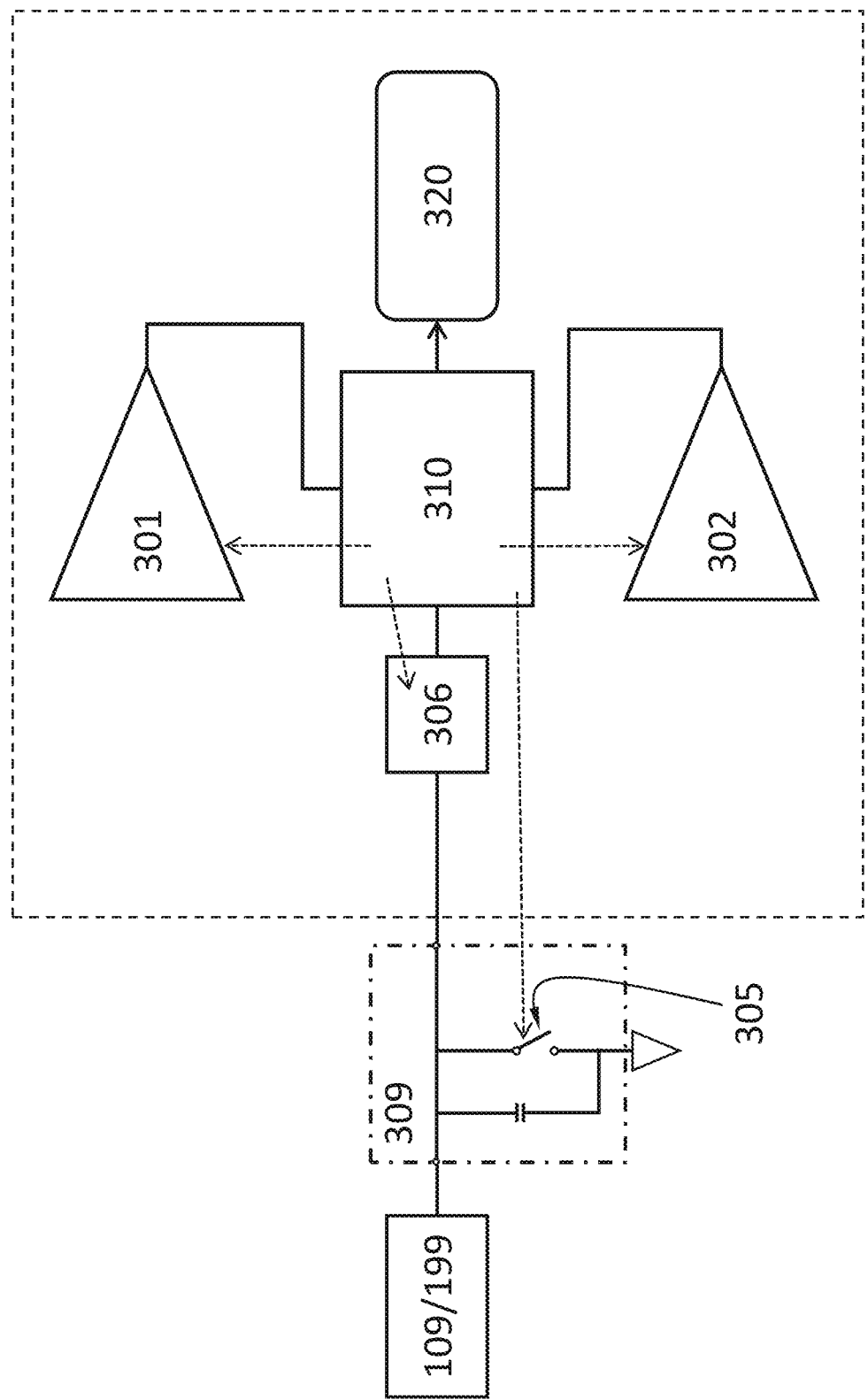

FIG. 8A and FIG. 8B each show a component diagram of the electronic system 121, according to an embodiment. The electronic system 121 may include a first voltage comparator 301, a second voltage comparator 302, a counter 320, a switch 305, a voltmeter 306 and a controller 310.

The first voltage comparator 301 is configured to compare the voltage of an electrode (e.g., the second doped semiconductor region 109 on the semiconductor nanocrystals 106 or the electrode 199 on the semiconductor nanocrystals 196) to a first threshold. The first voltage comparator 301 may be configured to monitor the voltage directly, or calculate the voltage by integrating an electric current flowing through the electrode over a period of time. The first voltage comparator 301 may be controllably activated or deactivated by the controller 310. The first voltage comparator 301 may be a continuous comparator. Namely, the first voltage comparator 301 may be configured to be activated continuously, and monitor the voltage continuously. The first voltage comparator 301 configured as a continuous comparator reduces the chance that the electronic system 121 missing signals generated by an incident radiation particle. The first voltage comparator 301 configured as a continuous comparator is especially suitable when the incident radiation intensity is relatively high. The first voltage comparator 301 may be a clocked comparator, which has the benefit of lower power consumption. The first voltage comparator 301 configured as a clocked comparator may cause the electronic system 121 to miss signals generated by some incident radiation particles. When the incident radiation intensity is low, the chance of missing an incident radiation particle is low because the time interval between two successive radiation particles is relatively long. Therefore, the first voltage comparator 301 configured as a clocked comparator is especially suitable when the incident radiation intensity is relatively low. The first threshold may be 5-10%, 10%-20%, 20-30%, 30-40% or 40-50% of the maximum voltage one incident radiation particle may generate in the semiconductor nanocrystals 106 or 196. The maximum voltage may depend on the energy of the incident radiation particle (i.e., the wavelength of the incident radiation), the material of the radiation absorption layer 110 or 191, and other factors. For example, the first threshold may be 50 mV, 100 mV, 150 mV, or 200 mV.

The second voltage comparator 302 is configured to compare the voltage to a second threshold. The second voltage comparator 302 may be configured to monitor the voltage directly, or calculate the voltage by integrating an electric current flowing through the electrode over a period of time. The second voltage comparator 302 may be a continuous comparator. The second voltage comparator 302 may be controllably activated or deactivated by the controller 310. When the second voltage comparator 302 is deactivated, the power consumption of the second voltage comparator 302 may be less than 1%, less than 5%, less than 10% or less than 20% of the power consumption when the second voltage comparator 302 is activated. The absolute value of the second threshold is greater than the absolute value of the first threshold. As used herein, the term "absolute value" or "modulus" |x| of a real number x is the non-negative value of x without regard to its sign. Namely, $$|x| = \begin{cases} x, \text{ if } x \geq 0 \\ -x, \text{ if } x \leq 0 \end{cases}.$$

The second threshold may be 200%-300% of the first threshold. The second threshold may be at least 50% of the maximum voltage one incident radiation particle may generate in the semiconductor nanocrystals 106 or 196. For example, the second threshold may be 100 mV, 150 mV, 200 mV, 250 mV or 300 mV. The second voltage comparator 302 and the first voltage comparator 310 may be the same component. Namely, the system 121 may have one voltage comparator that can compare a voltage with two different thresholds at different times.

The first voltage comparator 301 or the second voltage comparator 302 may include one or more op-amps or any other suitable circuitry. The first voltage comparator 301 or the second voltage comparator 302 may have a high speed to allow the electronic system 121 to operate under a high flux of incident radiation. However, having a high speed is often at the cost of power consumption.

The counter 320 is configured to register a number of radiation particles reaching the semiconductor nanocrystals 106 or 196. The counter 320 may be a software component (e.g., a number stored in a computer memory) or a hardware component (e.g., a 4017 IC and a 7490 IC).

The controller 310 may be a hardware component such as a microcontroller and a microprocessor. The controller 310 is configured to start a time delay from a time at which the first voltage comparator 301 determines that the absolute value of the voltage equals or exceeds the absolute value of the first threshold (e.g., the absolute value of the voltage increases from below the absolute value of the first threshold to a value equal to or above the absolute value of the first threshold). The absolute value is used here because the voltage may be negative or positive, depending on the voltage of which electrode (e.g., a cathode or an anode) is used. The controller 310 may be configured to keep deactivated the second voltage comparator 302, the counter 320 and any other circuits the operation of the first voltage comparator 301 does not require, before the time at which the first voltage comparator 301 determines that the absolute value of the voltage equals or exceeds the absolute value of the first threshold. The time delay may expire before or after the voltage becomes stable, i.e., the rate of change of the voltage is substantially zero. The phase "the rate of change of the voltage is substantially zero" means that temporal change of the voltage is less than 0.1%/ns. The phase "the rate of change of the voltage is substantially non-zero" means that temporal change of the voltage is at least 0.1%/ns.

The controller 310 may be configured to activate the second voltage comparator during (including the beginning and the expiration) the time delay. In an embodiment, the controller 310 is configured to activate the second voltage comparator at the beginning of the time delay. The term "activate" means causing the component to enter an operational state (e.g., by sending a signal such as a voltage pulse or a logic level, by providing power, etc.). The term "deactivate" means causing the component to enter a non-operational state (e.g., by sending a signal such as a voltage pulse or a logic level, by cut off power, etc.). The operational state may have higher power consumption (e.g., 10 times higher, 100 times higher, 1000 times higher) than the non-operational state. The controller 310 itself may be deactivated until the output of the first voltage comparator 301 activates the controller 310 when the absolute value of the voltage equals or exceeds the absolute value of the first threshold.

The controller 310 may be configured to cause the number registered by the counter 320 to increase by one, if, during the time delay, the second voltage comparator 302 determines that the absolute value of the voltage equals or exceeds the absolute value of the second threshold.

The controller 310 may be configured to cause the voltmeter 306 to measure the voltage upon expiration of the time delay. The controller 310 may be configured to connect the electrode to an electrical ground, so as to reset the voltage and discharge any charge carriers accumulated on the electrode. In an embodiment, the electrode is connected to an electrical ground after the expiration of the time delay. In an embodiment, the electrode is connected to an electrical ground for a finite reset time period. The controller 310 may connect the electrode to the electrical ground by controlling the switch 305. The switch may be a transistor such as a field-effect transistor (FET).

In an embodiment, the system 121 has no analog filter network (e.g., a RC network). In an embodiment, the system 121 has no analog circuitry.

The voltmeter 306 may feed the voltage it measures to the controller 310 as an analog or digital signal.

The electronic system 121 may include a capacitor module 309 electrically connected to the electrode, wherein the capacitor module is configured to collect charge carriers from the electrode. The capacitor module can include a capacitor in the feedback path of an amplifier. The amplifier configured as such is called a capacitive transimpedance amplifier (CTIA). CTIA has high dynamic range by keeping the amplifier from saturating and improves the signal-to-noise ratio by limiting the bandwidth in the signal path. Charge carriers from the electrode accumulate on the capacitor over a period of time ("integration period") (e.g., as shown in FIG. 7, between $t_0$ to $t_1$, or $t_1$-$t_2$). After the integration period has expired, the capacitor voltage is sampled and then reset by a reset switch. The capacitor module can include a capacitor directly connected to the electrode.

Figure 9:
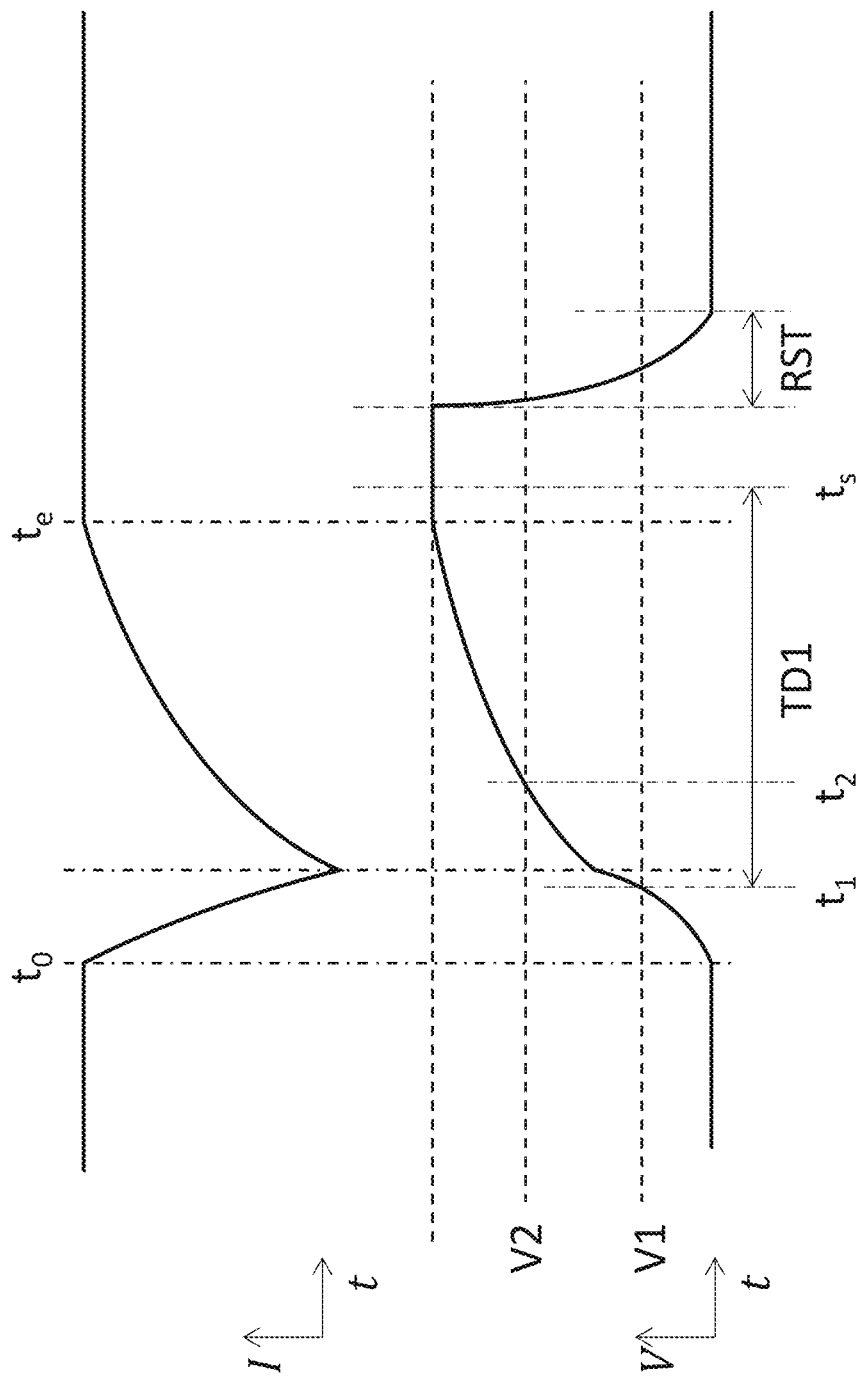
FIG. 9 schematically shows a temporal change of the voltage of the electrode or the electrical contact, according to an embodiment.

FIG. 9 schematically shows a temporal change of the electric current flowing through the electrode (upper curve) caused by charge carriers generated by a radiation particle incident on the semiconductor nanocrystals 106 or 196, and a corresponding temporal change of the voltage of the electrode (lower curve). The voltage may be an integral of the electric current with respect to time. At time $t_0$, the radiation particle hits the semiconductor nanocrystals 106 or 196, charge carriers start being generated in the semiconductor nanocrystals 106 or 196, electric current starts to flow through the electrode of the semiconductor nanocrystals 106 or 196, and the absolute value of the voltage of the electrode or electrode starts to increase. At time $t_1$, the first voltage comparator 301 determines that the absolute value of the voltage equals or exceeds the absolute value of the first threshold V1, and the controller 310 starts the time delay TD1 and the controller 310 may deactivate the first voltage comparator 301 at the beginning of TD1. If the controller 310 is deactivated before $t_1$, the controller 310 is activated at $t_1$. During TD1, the controller 310 activates the second voltage comparator 302. The term "during" a time delay as used here means the beginning and the expiration (i.e., the end) and any time in between. For example, the controller 310 may activate the second voltage comparator 302 at the expiration of TD1. If during TD1, the second voltage comparator 302 determines that the absolute value of the voltage equals or exceeds the absolute value of the second threshold at time $t_2$, the controller 310 causes the number registered by the counter 320 to increase by one. At time $t_e$, all charge carriers generated by the radiation particle drift out of the radiation absorption layer 110. At time $t_s$, the time delay TD1 expires. In the example of FIG. 9, time $t_s$ is after time $t_e$; namely TD1 expires after all charge carriers generated by the radiation particle drift out of the radiation absorption layer 110 or 191. The rate of change of the voltage is thus substantially zero at $t_s$. The controller 310 may be configured to deactivate the second voltage comparator 302 at expiration of TD1 or at $t_2$, or any time in between.

The controller 310 may be configured to cause the voltmeter 306 to measure the voltage upon expiration of the time delay TD1. In an embodiment, the controller 310 causes the voltmeter 306 to measure the voltage after the rate of change of the voltage becomes substantially zero after the expiration of the time delay TD1. The voltage at this moment is proportional to the amount of charge carriers generated by a radiation particle, which relates to the energy of the radiation particle. The controller 310 may be configured to determine the energy of the radiation particle based on voltage the voltmeter 306 measures. One way to determine the energy is by binning the voltage. The counter 320 may have a sub-counter for each bin. When the controller 310 determines that the energy of the radiation particle falls in a bin, the controller 310 may cause the number registered in the sub-counter for that bin to increase by one. Therefore, the electronic system 121 may be able to detect a radiation image and may be able to resolve radiation particle energies of each radiation particle.

After TD1 expires, the controller 310 connects the electrode to an electric ground for a reset period RST to allow charge carriers accumulated on the electrode to flow to the ground and reset the voltage. After RST, the electronic system 121 is ready to detect another incident radiation particle. Implicitly, the rate of incident radiation particles the electronic system 121 can handle in the example of FIG. 10 is limited by 1/(TD1+RST). If the first voltage comparator 301 has been deactivated, the controller 310 can activate it at any time before RST expires. If the controller 310 has been deactivated, it may be activated before RST expires.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method comprising:
    forming a recess into a semiconductor substrate, wherein a portion of the semiconductor substrate extends into the recess and is surrounded by the recess;
    depositing semiconductor nanocrystals into the recess, the semiconductor nanocrystals having a different composition from the semiconductor substrate;
    forming a first doped semiconductor region in the semiconductor substrate;
    forming a second doped semiconductor region in the semiconductor substrate;
    wherein the first doped semiconductor region and the second doped semiconductor region form a p-n junction that separates the portion from the rest of the semiconductor substrate.

2. The method of claim 1, wherein the first doped semiconductor region surrounds the second doped semiconductor region.

3. The method of claim 1, wherein the second doped semiconductor region is in electrical contact with the portion.

4. The method of claim 1, wherein forming the second doped semiconductor region comprises doping a portion of the first doped semiconductor region.

5. The method of claim 1, wherein the first doped semiconductor region extends from a surface of the semiconductor substrate to an interface between the recess and the semiconductor substrate.

6. The method of claim 1, wherein the second doped semiconductor region is coextensive with the first doped semiconductor region.

7. The method of claim 1, wherein forming the recess comprises forming a mask on the semiconductor substrate and etching an area of the semiconductor substrate uncovered by the mask.

8. The method of claim 1, wherein the semiconductor substrate comprises silicon, germanium, GaAs or a combination thereof.

9. The method of claim 1, wherein the semiconductor nanocrystals are cadmium zinc telluride (CdZnTe) nanocrystals, cadmium telluride (CdTe) nanocrystals, cadmium selenide (CdSe) nanocrystals, cadmium sulfide (CdS) nanocrystals, or lead sulfide (PbS) nanocrystals.

10. The method of claim 1, wherein the recess has a shape of a frustum, prism, pyramid, cuboid, or cylinder.

11. The method of claim 1, wherein the semiconductor nanocrystals have diameters of 10 nanometer or less.

12. The method of claim 1, further comprising bonding the semiconductor substrate to another substrate comprising an electronic system therein or thereon, wherein the electronic system is electrically connected to the second doped semiconductor region and configured to process an electrical signal generated in the semiconductor substrate.

13. A method comprising:
    forming a through hole in a semiconductor layer supported directly on an electrical insulator layer, wherein a portion of the semiconductor layer remains in and is surrounded by the through hole;
    depositing semiconductor nanocrystals into the through hole, the semiconductor nanocrystals having a different composition from the semiconductor layer;
    forming an opening through the electrical insulator layer so that the portion is exposed in the opening;
    forming an electrode in the opening, the electrode being in electrical contact to the portion.

14. The method of claim 13, wherein forming the through hole comprises forming a mask on the semiconductor layer and etching an area of the semiconductor layer uncovered by the mask.

15. The method of claim 13, wherein the semiconductor layer comprises silicon, germanium, GaAs or a combination thereof.

16. The method of claim 13, wherein the electrical insulator layer comprises an oxide, a nitride or an oxynitride.

17. The method of claim 13, wherein the semiconductor nanocrystals are cadmium zinc telluride (CdZnTe) nanocrystals, cadmium telluride (CdTe) nanocrystals, cadmium selenide (CdSe) nanocrystals, cadmium sulfide (CdS) nanocrystals, or lead sulfide (PbS) nanocrystals.

18. The method of claim 13, wherein the through hole has a shape of a frustum, prism, pyramid, cuboid, or cylinder.

19. The method of claim 13, wherein the semiconductor nanocrystals have diameters of 10 nanometer or less.

20. The method of claim 13, further comprising bonding the electrical insulator layer to an electronics layer comprising an electronic system electrically connected to the electrode and configured to process an electrical signal generated in the semiconductor layer.

* * * * *